(12) United States Patent
Fuji

(10) Patent No.: US 12,211,817 B2
(45) Date of Patent: Jan. 28, 2025

(54) SEMICONDUCTOR DEVICE AND MANUFACTURING METHOD FOR SEMICONDUCTOR DEVICE

(71) Applicant: ROHM CO., LTD., Kyoto (JP)

(72) Inventor: Kazunori Fuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/490,468

(22) Filed: Oct. 19, 2023

(65) Prior Publication Data

US 2024/0047405 A1 Feb. 8, 2024

Related U.S. Application Data

(63) Continuation of application No. 17/295,801, filed as application No. PCT/JP2019/047161 on Dec. 3, 2019, now Pat. No. 11,830,843.

(30) Foreign Application Priority Data

Dec. 18, 2018 (JP) .................................. 2018-236079

(51) Int. Cl.
*H01L 23/48* (2006.01)
*H01L 23/00* (2006.01)

(52) U.S. Cl.
CPC .............. *H01L 24/20* (2013.01); *H01L 24/19* (2013.01); *H01L 24/32* (2013.01); *H01L 24/73* (2013.01);
(Continued)

(58) Field of Classification Search
CPC ... H01L 2224/0233; H01L 2224/02379; H01L 2225/1041; H01L 2225/1094; H01L 23/36
(Continued)

(56) References Cited

U.S. PATENT DOCUMENTS 8,410,592 B2 * 4/2013 Otremba ........... H01L 23/49537
257/781
8,421,226 B2 4/2013 Meyer et al.
(Continued)

FOREIGN PATENT DOCUMENTS

JP 2014-197568 A 10/2014
JP 2016-62954 A 4/2016
(Continued)

OTHER PUBLICATIONS

Decision of Rejection received in the corresponding Chinese Patent application, May 21, 2024, and machine translation (17 pages).
(Continued)

*Primary Examiner* — Nitin Parekh
(74) *Attorney, Agent, or Firm* — HSML P.C.

(57) ABSTRACT

A semiconductor device includes an insulating layer, conductors, a semiconductor element and a sealing resin. The insulating layer has first and second surfaces opposite to each other in the thickness direction. Each conductor has an embedded part whose portion is embedded in the insulating layer and a redistribution part disposed at the second surface and connected to the embedded part. The semiconductor element has electrodes provided near the first surface and connected the embedded parts of the conductors. The semiconductor element is in contact with the first surface. The sealing resin partially covers the semiconductor element and is in contact with the first surface. The redistribution parts include portions outside the semiconductor element as viewed in the thickness direction. The insulating layer has grooves recessed from the second surface in the thickness direction. The redistribution parts are in contact with the grooves.

5 Claims, 26 Drawing Sheets

(52) U.S. Cl.
CPC . *H01L 2224/2101* (2013.01); *H01L 2224/211* (2013.01); *H01L 2224/32245* (2013.01); *H01L 2224/73267* (2013.01); *H01L 2924/12041* (2013.01); *H01L 2924/13091* (2013.01)

(58) Field of Classification Search
USPC .......................................................... 257/773
See application file for complete search history.

(56) References Cited

U.S. PATENT DOCUMENTS

| | | | |
|---|---|---|---|
| 10,347,585 B2 | 7/2019 | Shin | |
| 2006/0017174 A1* | 1/2006 | Otremba | H01L 24/02 257/E23.044 |
| 2006/0138532 A1* | 6/2006 | Okamoto | H01L 24/37 257/E23.044 |
| 2007/0267729 A1* | 11/2007 | Otremba | H01L 23/492 257/E23.071 |
| 2009/0137086 A1 | 5/2009 | Otremba et al. | |
| 2010/0019370 A1 | 1/2010 | Pressel et al. | |
| 2010/0237506 A1 | 9/2010 | Brunnbauer et al. | |
| 2011/0180891 A1 | 7/2011 | Lin et al. | |
| 2011/0198762 A1 | 8/2011 | Scanlan | |
| 2011/0233754 A1 | 9/2011 | Meyer-Berg | |
| 2015/0364430 A1 | 12/2015 | Lin | |
| 2016/0225745 A1* | 8/2016 | Beer | H01L 25/0657 |
| 2018/0182913 A1 | 6/2018 | Chen et al. | |
| 2020/0328144 A1 | 10/2020 | Fan et al. | |
| 2020/0328497 A1 | 10/2020 | Lin et al. | |

FOREIGN PATENT DOCUMENTS

| | | |
|---|---|---|
| JP | 2016-63178 A | 4/2016 |
| JP | 2016-89081 A | 5/2016 |
| JP | 2016-178334 A | 10/2016 |
| JP | 2018-6385 A | 1/2018 |

OTHER PUBLICATIONS

Office Action received in the corresponding Japanese Patent application, Nov. 1, 2022, and machine translation (8 pages).
Office Action received in the corresponding Japanese Patent application, Feb. 21, 2023, and machine translation (10 pages).
Office Action received in the corresponding Chinese Patent application, May 18, 2023, and machine translation (15 pages).
International Search Report issued in PCT/JP2019/047161, May 10, 2020 (2 pages).
Office Action received in the corresponding Chinese Patent application, Dec. 27, 2023, and machine translation (15 pages).
Office Action issued in corresponding Japanese Patent application No. 2023-085743, Sep. 3, 2024, and machine translation (7 pages).

* cited by examiner

SEMICONDUCTOR DEVICE AND MANUFACTURING METHOD FOR SEMICONDUCTOR DEVICE

TECHNICAL FIELD

The present disclosure relates to a semiconductor device of a Fan-Out type.

BACKGROUND ART

With recent miniaturization of electronic devices, size reduction of semiconductor devices for use in electronic devices is underway. A Fan-Out type semiconductor device is known as a device developed under such circumstances. This type of semiconductor device includes a semiconductor element having a plurality of electrodes, an insulating layer in contact with the semiconductor element, a plurality of conductors disposed on the insulating layer and connected to the electrodes, and a sealing resin disposed in contact with the insulating layer and covering a portion of the semiconductor element. The conductors include portions that are located outside the semiconductor element as viewed in the thickness direction. Such a configuration makes it possible to adapt the semiconductor device to various shapes of wiring patterns of a wiring board on which the semiconductor device is to be mounted while also achieving the size reduction of the semiconductor device.

Patent Document 1 discloses an example of a method of manufacturing such a Fan-Out type semiconductor device. The manufacturing method includes the steps of embedding a semiconductor element having a plurality of electrodes into a sealing resin (a cured member in Patent Document 1), forming an insulating layer (a buffer coat film in Patent Document 1) in contact with both the semiconductor element and the sealing resin, and forming a plurality of conductors connected to the electrodes. The step of embedding the semiconductor element into the sealing resin is performed such that the electrodes are exposed from the sealing resin. In the step of forming an insulating layer, a plurality of openings are formed in the insulating layer such that the electrodes are exposed by photolithography patterning using a mask. In the step of forming the conductors, a plating layer is formed in the openings of the insulating layer and on the insulating layer.

In the step of embedding the semiconductor element into the sealing resin, the sealing resin undergoes shrinkage in curing, which causes displacement of the semiconductor element. Forming openings in the insulating layer in this state results in misalignment between the openings and the electrodes. Forming conductors in such a condition causes misalignment between the electrodes and the conductors at the joint portion. To improve the reliability of the semiconductor device, it is desired to prevent such misalignment.

TECHNICAL REFERENCE

Patent Document

Patent Document 1: JP-A-2016-89081

SUMMARY OF THE INVENTION

Problems to be Solved by the Invention

The present disclosure has been proposed under the above-noted circumstances, and an object of the present disclosure is to provide a semiconductor device capable of preventing misalignment between the electrodes of a semiconductor element and conductors at the joint portion and a method of manufacturing such a semiconductor device.

Means for Solving the Problems

A semiconductor device provided according to a first aspect of the present disclosure comprises: a first insulating layer having a first surface and a second surface facing away from each other in a thickness direction; a plurality of first conductors each having a first embedded part and a first redistribution part, with at least a portion of the first embedded part being embedded in the first insulating layer, and with the first redistribution part being disposed at the second surface and connected to the first embedded part; a semiconductor element that is in contact with the first surface and has a plurality of electrodes, with the electrodes being provided near the first surface and connected to at least a predetermined number of the first embedded parts of the first conductors; and a sealing resin that is in contact with the first surface and covers a portion of the semiconductor element. The first redistribution parts of the first conductors include portions located outside the semiconductor element as viewed in the thickness direction. The first insulating layer has a plurality of first grooves recessed from the second surface in the thickness direction. The first redistribution parts of the first conductors are in contact with the first grooves.

A method of manufacturing a semiconductor device provided according to a second aspect of the present disclosure comprises the steps of: embedding a semiconductor element having a plurality of electrodes on one side in a thickness direction into a sealing resin such that the electrodes are exposed; forming an insulating layer laminated on the sealing resin and covering the electrodes; and forming a plurality of conductors each having an embedded part and a redistribution part, with the embedded part being embedded in the insulating layer and connected to a relevant one of the electrodes, and with the redistribution part being disposed on the insulating layer and connected to the embedded part. The insulating layer is made of a material containing a thermosetting synthetic resin and an additive that contains a metallic element forming portions of the conductors. The step of forming a plurality of conductors includes: forming with a laser in the insulating layer a plurality of holes that expose the electrodes and a plurality of grooves recessed from a surface of the insulating layer and connected to the holes to thereby deposit a base layer that covers wall surfaces defining the holes and the grooves; and forming a plating layer covering the base layer.

Other features and advantages of the present disclosure will become clearer from the detailed description given below with reference to the accompanying drawings.

MODE FOR CARRYING OUT THE INVENTION

Modes for carrying out the present disclosure are described below with reference to the accompanying drawings.

First Embodiment

Figure 1:
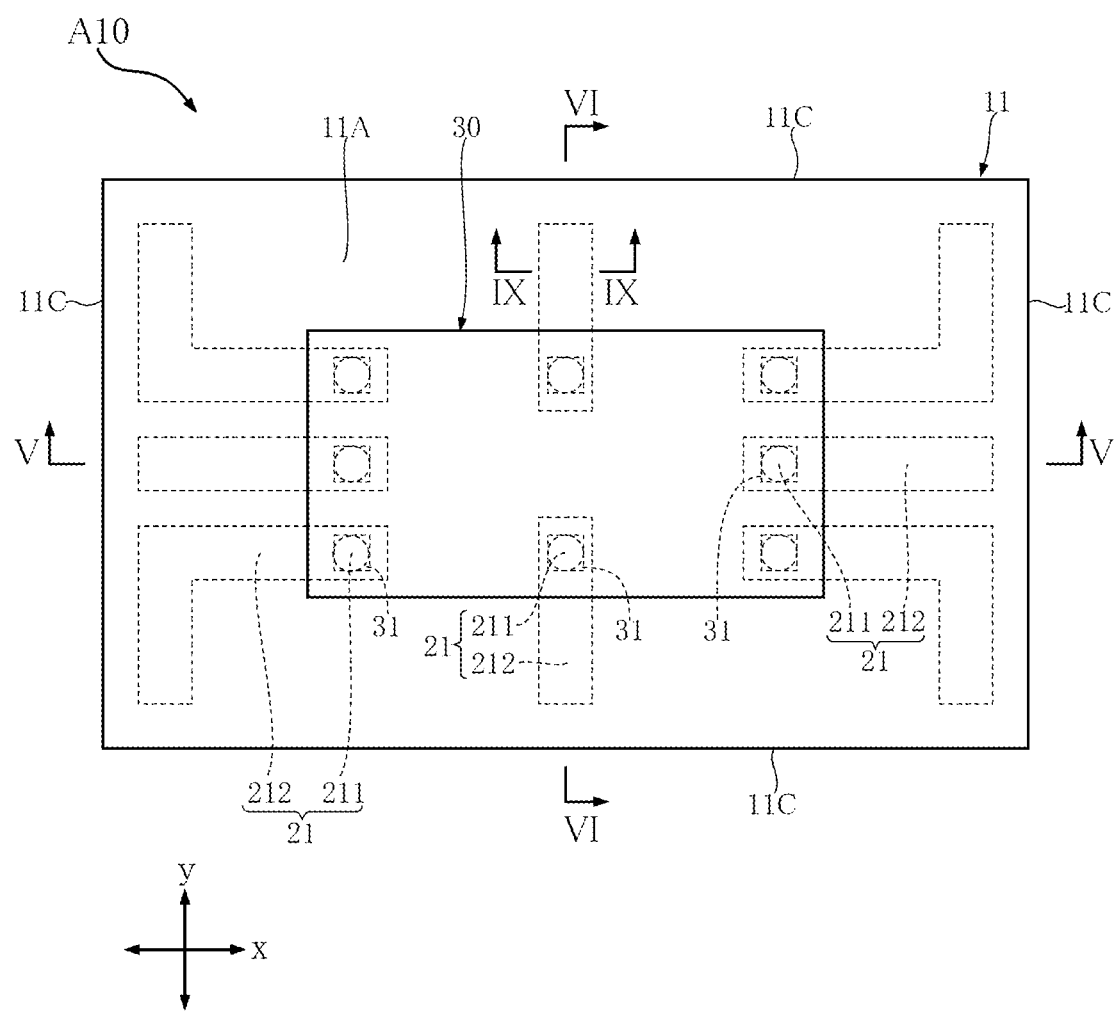
FIG. 1 is a plan view of a semiconductor device according to a first embodiment of the present disclosure, as seen through a sealing resin.
Figure 2:
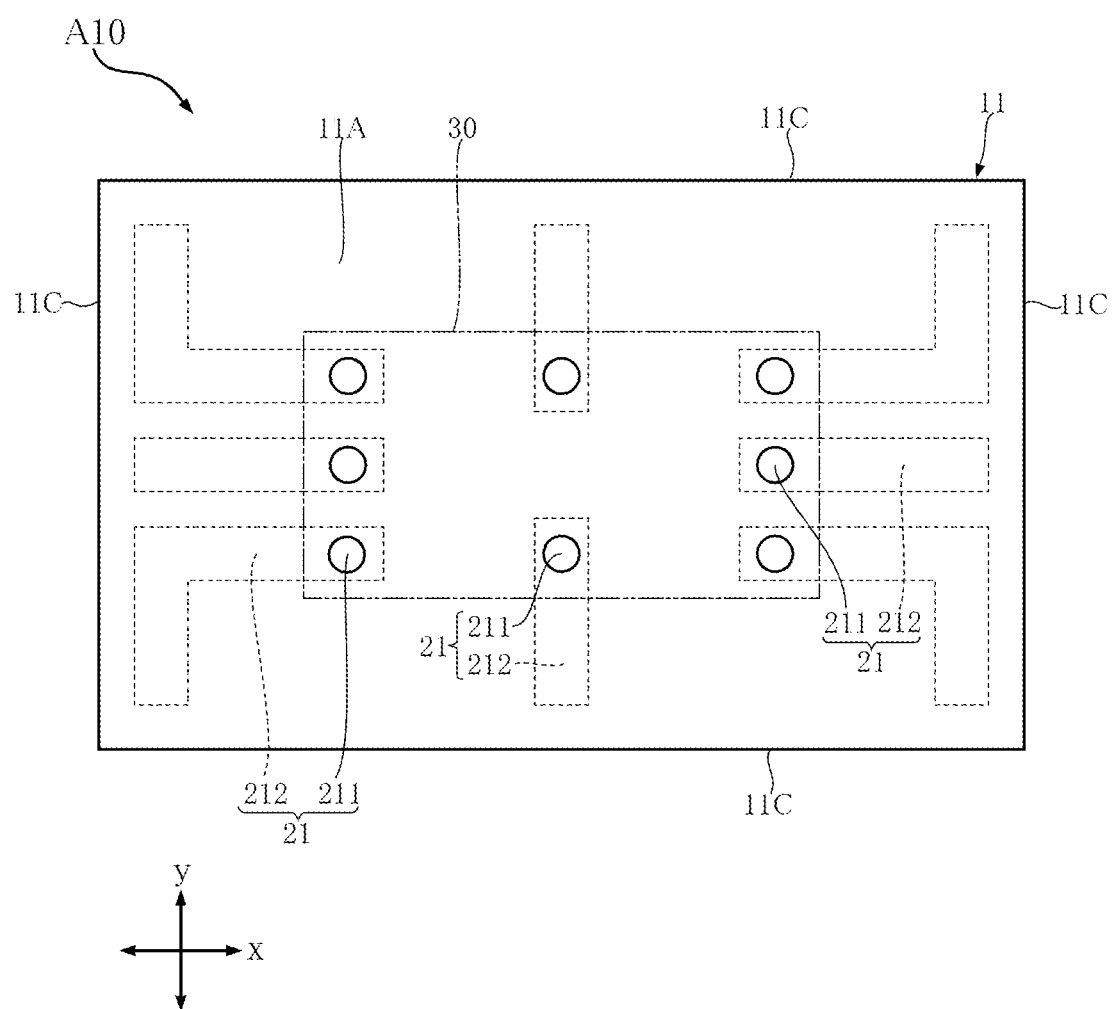
FIG. 2 is a plan view corresponding to FIG. 1, in which a semiconductor element is illustrated as transparent.
Figure 3:
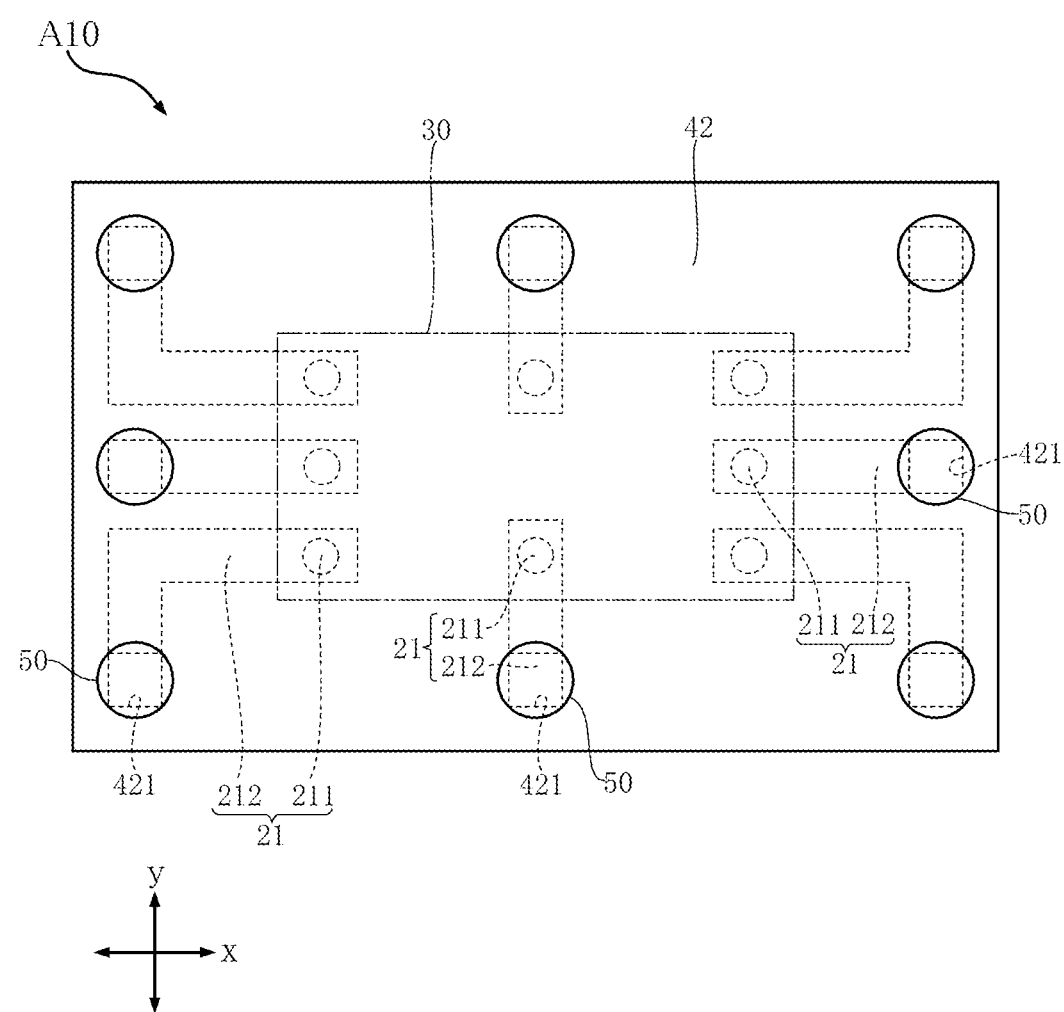
FIG. 3 is a bottom view of the semiconductor device shown in FIG. 1.
Figure 4:
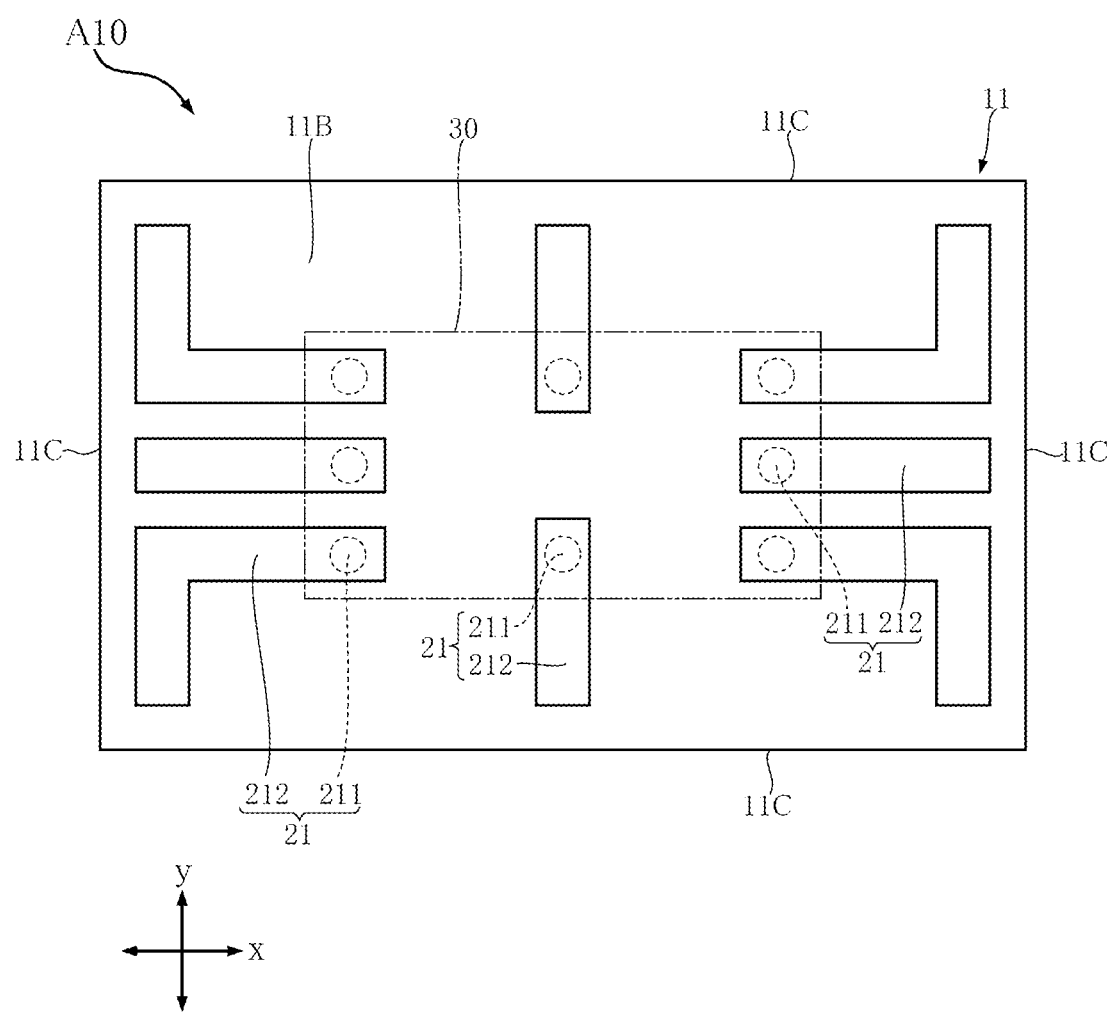
FIG. 4 is a bottom view corresponding to FIG. 3, as seen through a protective layer and a plurality of terminals.

A semiconductor device A10 according to a first embodiment of the present disclosure is described below based on FIGS. 1-9. The semiconductor device A10 includes a first insulating layer 11, a plurality of first conductors 21, a semiconductor element 30, a sealing resin 41, a protective layer 42 and a plurality of terminals 50. The semiconductor device A10 is of a Fan-Out package type to be surface-mounted on a wiring board. In FIG. 1, the sealing resin 41 is illustrated as transparent for convenience of understanding. FIG. 2 corresponds to FIG. 1, but the semiconductor element 30 is also illustrated as transparent for convenience of understanding. In FIG. 4, the protective layer 42 and the terminals 50 are illustrated as transparent for convenience of understanding. In FIG. 2, the outline of the semiconductor element 30, which is illustrated as transparent, is shown by imaginary lines (double-dashed lines).

In the description of the semiconductor device A10, the thickness direction of the first insulating layer 11 is referred to as "thickness direction z". A direction orthogonal to the thickness direction z is referred to as "first direction x". The direction orthogonal to both the thickness direction z and the first direction x is referred to as "second direction y". As shown in FIG. 1, the outer shape of the semiconductor device A10 is rectangular as viewed in the thickness direction z. The first direction x corresponds to the longitudinal direction of the semiconductor device A10. The second direction y corresponds to the widthwise direction of the semiconductor device A10. Note that the thickness direction z, the first direction x and the second direction y are applied to the description of the semiconductor devices A20-A40 described later.

Figure 5:
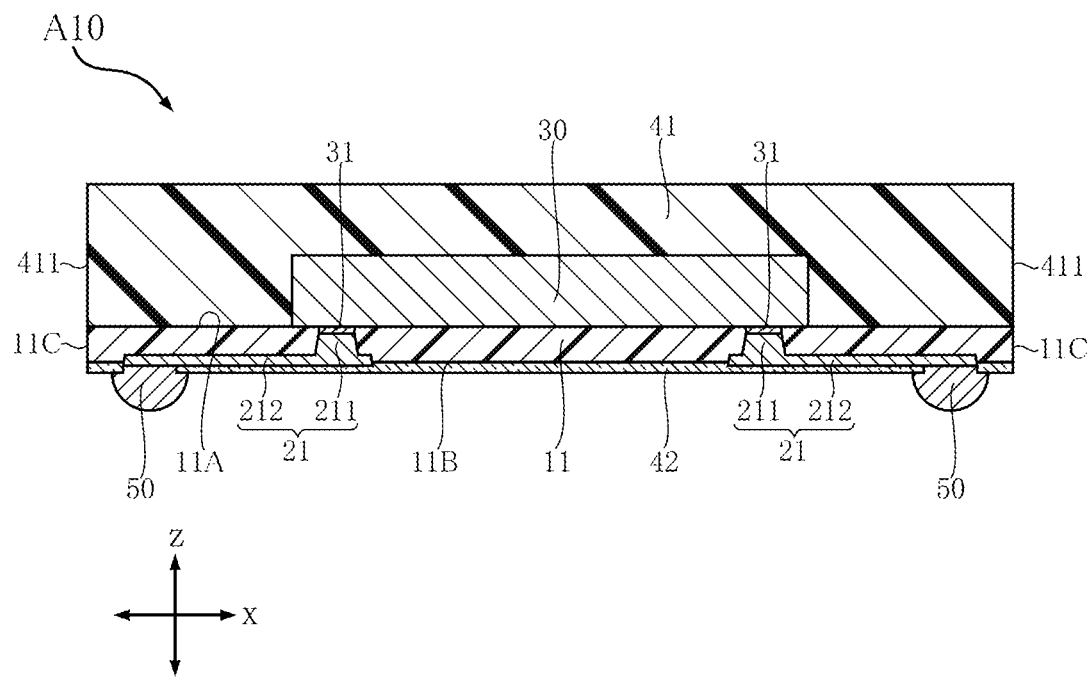
FIG. 5 is a sectional view taken along line V-V in FIG. 1.
Figure 6:
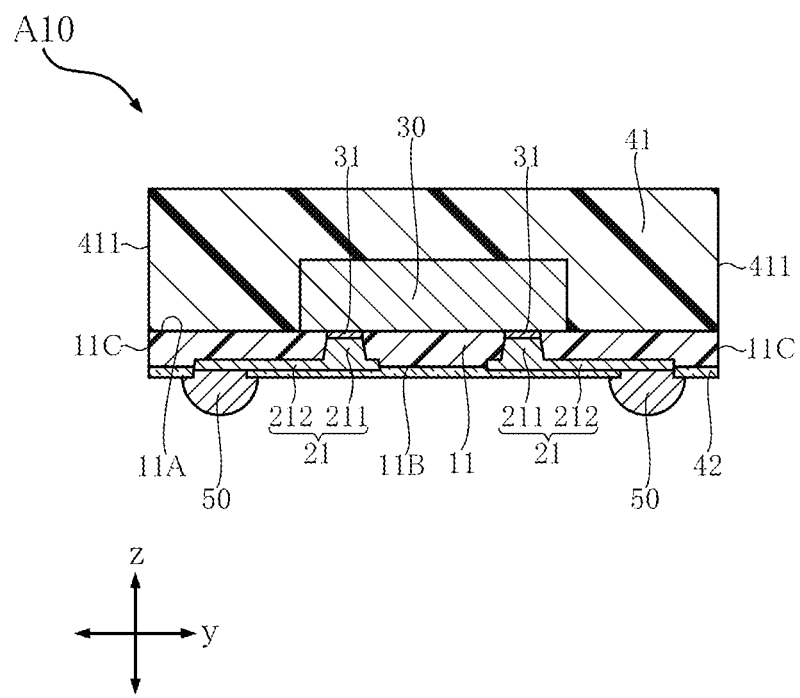
FIG. 6 is a sectional view taken along line VI-VI in FIG. 1.

As shown in FIGS. 5 and 6, the first insulating layer 11 faces the semiconductor element 30 in the thickness direction z. The first insulating layer 11 is made of a material containing a thermosetting synthetic resin and an additive that contains a metallic element forming portions of the first conductors 21. The synthetic resin may be an epoxy resin or a polyimide resin, for example. The first insulating layer 11 has a first surface 11A, a second surface 11B and a plurality of end surfaces 11C. The first surface 11A and the second surface 11B face away from each other in the thickness direction z. The first surface 11A faces the semiconductor element 30. In the semiconductor device A10, when the semiconductor device A10 is mounted on a wiring board, the second surface 11B faces the wiring board. The end surfaces 11C are connected to both the first surface 11A and the second surface 11B. Each of the end surfaces 11C faces either the first direction x or the second direction y.

Figure 7:
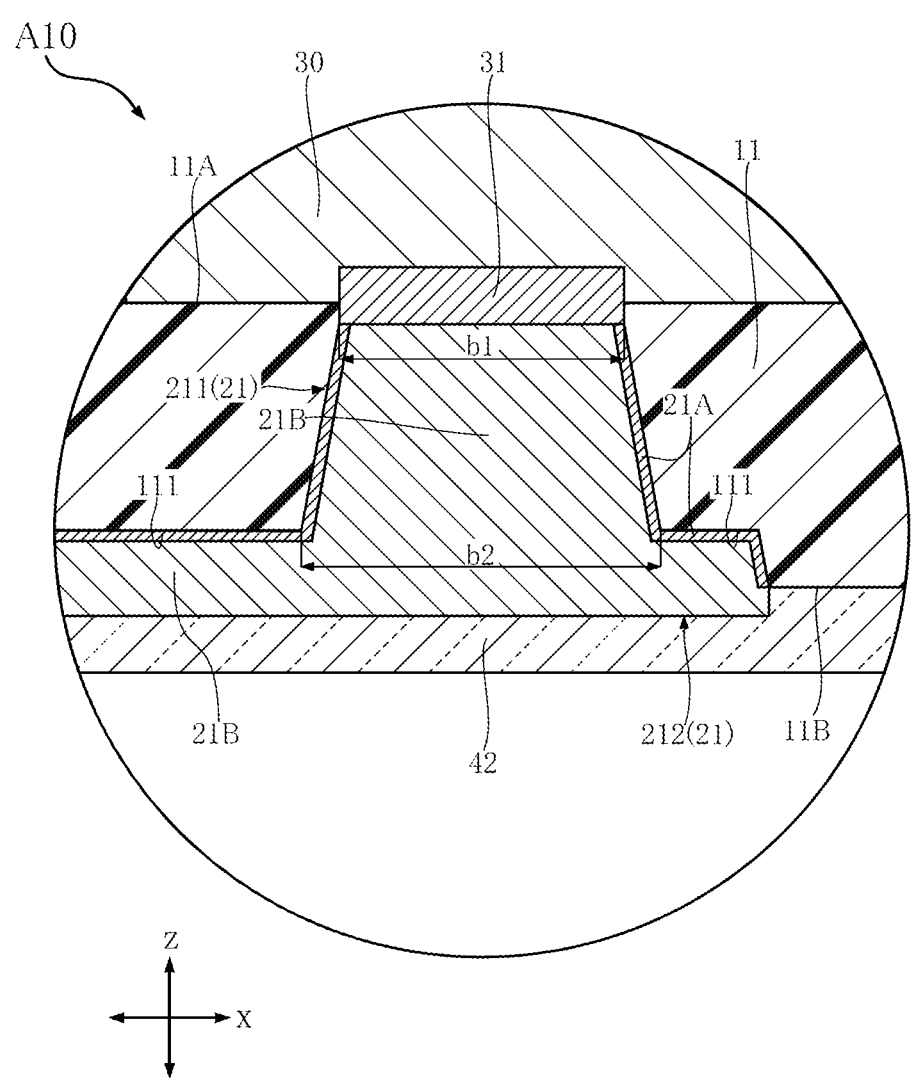
FIG. 7 is a partial enlarged view of FIG. 5.
Figure 8:
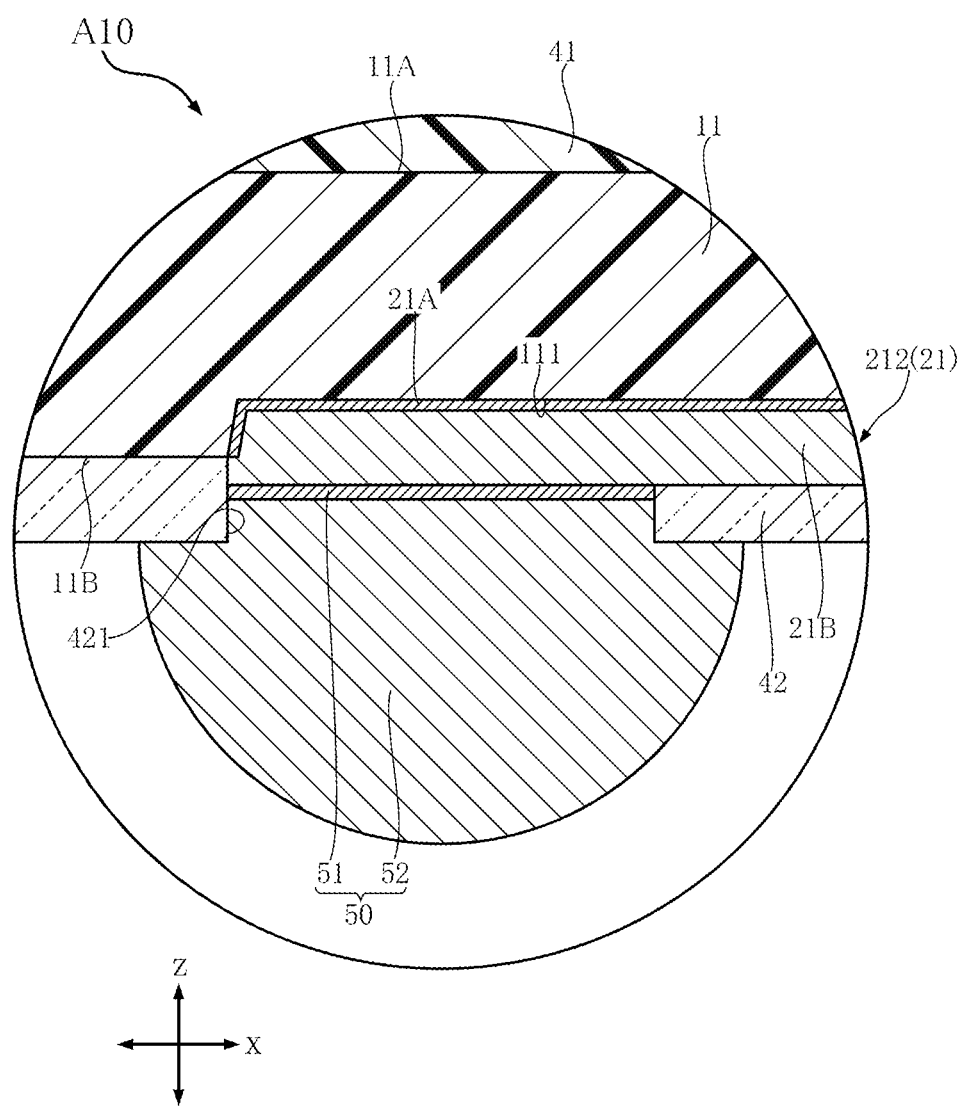
FIG. 8 is a partial enlarged view of FIG. 5.
Figure 9:
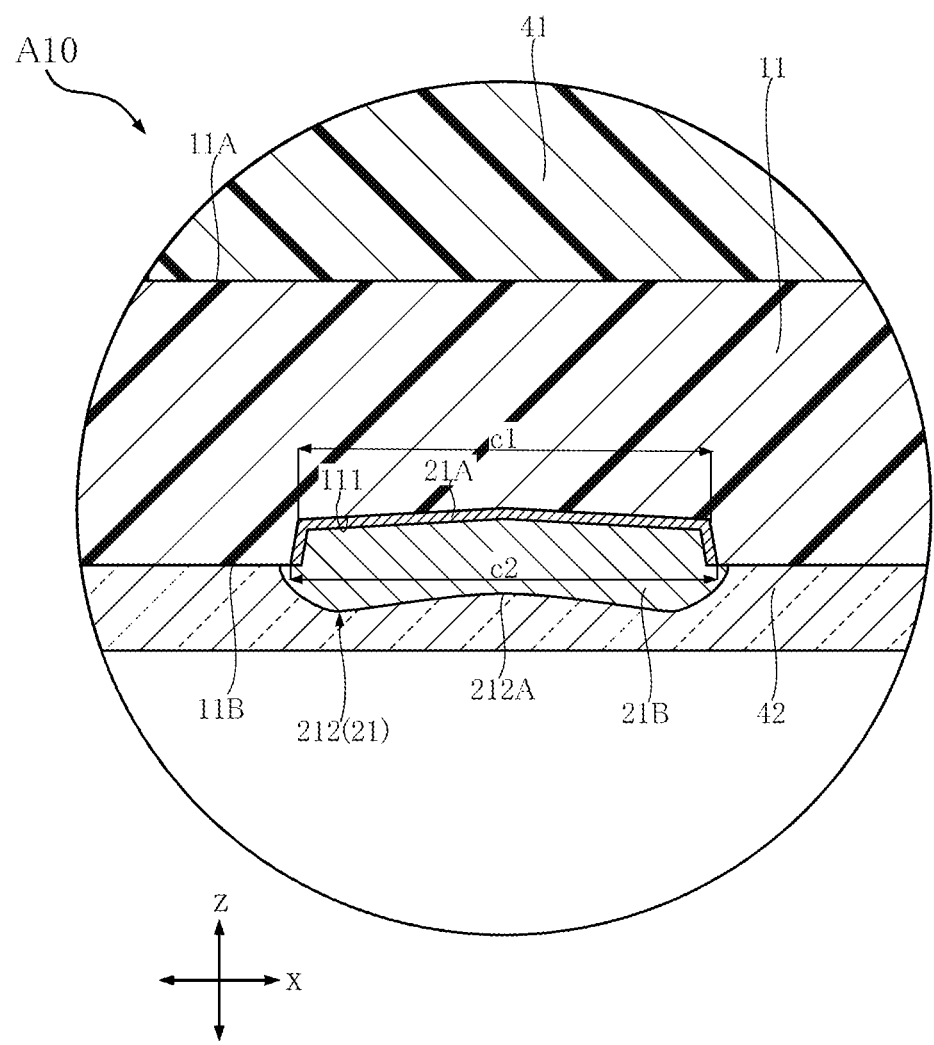
FIG. 9 is a partial enlarged sectional view taken along line IX-IX in FIG. 1.

As shown in FIGS. 7-9, the first insulating layer 11 has a plurality of first grooves 111. The first grooves 111 are recessed from the second surface 11B in the thickness direction z. As shown in FIG. 9, the side surfaces of each of the first grooves 111 are flared in the thickness direction z from the bottom surface of the first groove 111 toward the second surface 11B. In each of the first grooves 111, the dimension c1 of the bottom surface of the first groove 111 in the first direction x is smaller than the dimension c2 between the two boundaries between the first groove 111 and the second surface 11B, which are spaced apart from each other in the first direction x.

As shown in FIGS. 5 and 6, the first conductors 21 are disposed in the first insulating layer 11. The first conductors 21 form a conduction path for supplying electric power to and inputting and outputting signals to and from the semiconductor element 30. Each of the first conductors 21 has a first embedded part 211 and a first redistribution part 212. At least a portion of each first embedded part 211 (the entirety in the semiconductor device A10) is embedded in the first insulating layer 11. As shown in FIG. 7, each first embedded part 211 has a side surface that is flared in the thickness direction z from the first surface 11A toward the second surface 11B of the first insulating layer 11. The dimension b1 in the direction orthogonal to the thickness direction z of the end surface of the first embedded part 211 that is closest to the first surface 11A is smaller than the dimension b2 in the direction orthogonal to the thickness direction z of the end surface of the first embedded part 211 that is closest to the second surface 11B. The first redistribution parts 212 are disposed at the second surface 11B of the first insulating layer 11. The first redistribution parts 212 are connected to the first embedded parts 211. As shown in FIGS. 1-4, as viewed in thickness direction z, the first redistribution parts 212 of the first conductors 21 have portions located outside the semiconductor element 30. The first redistribution parts 212 of the first conductors 21 are in contact with the first grooves 111 of the first insulating layer 11. That is, portions of the first redistribution parts 212 of the first conductors 21 are embedded in the first grooves 111.

As shown in FIGS. 7 and 8, each of the first embedded parts 211 of the first conductors 21 and each of the first redistribution parts 212 of the first conductors 21 has a base layer 21A and a plating layer 21B. The base layers 21A are made of a metallic element contained in the additive that is contained in the first insulating layer 11. The plating layers 21B may be made of a material containing copper (Cu), for example. The base layers 21A of the first embedded parts 211 are in contact with the first insulating layer 11. The plating layer 21B of each first embedded part 211 is surrounded by the base layer 21A of the first embedded part 211 around the thickness direction z. The base layer 21A of each first redistribution part 212 is in contact with a relevant one of the first grooves 111 of the first insulating layer 11. The plating layer 21B of each first redistribution part 212 covers the base layer 21A of the first redistribution part 212. As shown in FIG. 9, the plating layer 21B of each first redistribution part 212 has a recess 212A that is recessed in the thickness direction z. The recess 212A extends along the direction in which the first redistribution part 212 of the first conductor 21 extends.

As shown in FIGS. 5 and 6, the semiconductor element 30 is connected to the first conductors 21. The semiconductor element 30 is in contact with the first surface 11A of the first insulating layer 11. In the semiconductor device A10, the semiconductor element 30 is an LSI (Large Scale Integration) that includes, for example, a voltage control circuit such as an LDO (Low Drop Out) or an amplifier circuit such as an operational amplifier. In the semiconductor device A10, the semiconductor element 30 is a flip-chip type element. As shown in FIGS. 1, 5 and 6, the semiconductor element 30 has a plurality of electrodes 31. The electrodes 31 are provided near the first surface 11A. The electrodes 31 are electrically connected to the circuit constructed in the semiconductor element 30. The electrodes 31 may contain aluminum (Al), for example. The electrodes 31, some or all of them, may be directly connected to a corresponding number of the first embedded parts 211 of the first conductors 21 (all are connected in the semiconductor device A10). Thus, the semiconductor element 30 is electrically connected to the first conductors 21.

As shown in FIGS. 5 and 6, the sealing resin 41 covers a part of the semiconductor element 30. The sealing resin 41 is in contact with the first surface 11A of the first insulating layer 11. The sealing resin 41 may be made of a material containing a black epoxy resin, for example. The sealing resin 41 has a plurality of side surfaces 411. Each of the side surfaces 411 faces either the first direction x or the second direction y. Each of the side surfaces 411 is flush with one of the end surfaces 11C of the first insulating layer 11.

As shown in FIGS. 5 and 6, the protective layer 42 is in contact with the second surface 11B of the first insulating layer 11. The first redistribution parts 212 of the first conductors 21 are covered with the protective layer 42. The protective layer 42 is electrically insulating. The protective layer 42 may be made of a material containing polyimide, for example. As shown in FIGS. 3 and 8, the protective layer 42 has a plurality of openings 421. The openings penetrate the protective layer 42 in the thickness direction z. Portions of the first redistribution parts 212 of the first conductors 21 are exposed through the openings 421.

As shown in FIGS. 3 and 8, the terminals 50 are individually bonded to the portions of the first redistribution parts 212 of the first conductors 21 that are exposed through the openings 421 of the protective layer 42. The terminals 50 are used for mounting the semiconductor device A10 to a wiring board. The terminals 50 project from the protective layer 42 in the thickness direction z. As shown in FIG. 8, in the example of the semiconductor device A10, each of the terminals 50 has a base part 51 and a bump part 52. Each base part 51 is in contact with a portion of a relevant one of the first redistribution parts 212 of the first conductors 21. The base part 51 is made up of a plurality of metal layers laminated in the order of a nickel (Ni) layer, a palladium (Pd) layer and a gold (Au) layer in the direction away from the second surface 11B of the first insulating layer 11 in the thickness direction z. Of these metal layers, a palladium layer may not be provided. The bump part 52 is in contact with both of the base part 51 and the protective layer 42. The bump part 52 includes a portion projecting from the protective layer 42 in the thickness direction z. The bump part 52 is made of a material containing tin (Sn).

An example of a method of manufacturing the semiconductor device A10 is described below with reference to FIGS. 11-18. Note that FIGS. 11-18 (excluding FIGS. 13 and 15) are sectional views taken along the same plane as FIG. 5.

Figure 10:
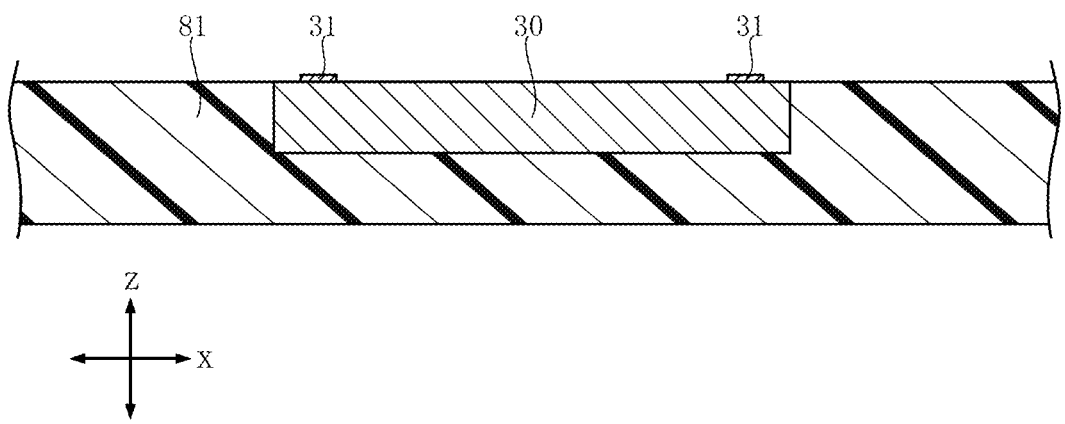
FIG. 10 is a sectional view illustrating a step of a manufacturing method for the semiconductor device shown in FIG. 1.

First, a semiconductor element 30 is embedded into a sealing resin 81, as shown in FIG. 10. The sealing resin 81 is made of a material containing a black epoxy resin. The semiconductor element 30 has a plurality of electrodes 31 on one side in the thickness direction z. In this step, after the material for the sealing resin 81 and the semiconductor element 30 are placed in a mold, compression molding is performed. In this way, the semiconductor element 30 is embedded into the sealing resin 81. This step is performed such that the electrodes 31 are exposed from the sealing resin 81.

Figure 11:
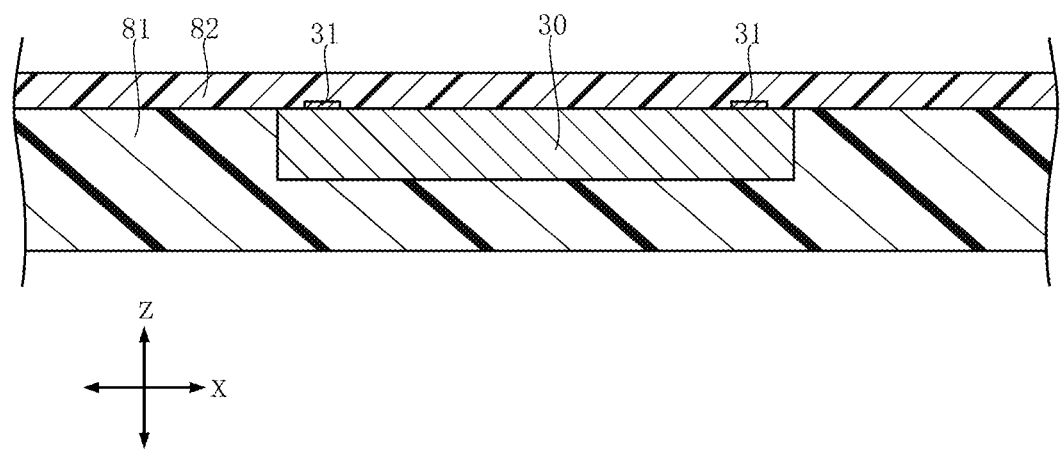
FIG. 11 is a sectional view illustrating a step of the manufacturing method for the semiconductor device shown in FIG. 1.

Next, as shown in FIG. 11, an insulating layer 82 is laminated on the sealing resin 81 to cover the electrodes 31 of the semiconductor element 30. The insulating layer 82 is made of a material containing a thermosetting synthetic resin and an additive that contains a metallic element that will form portions of conductors 83 (described later). The synthetic resin may be an epoxy resin or a polyimide resin, for example. The insulating layer 82 is formed by compression molding.

Figure 12:
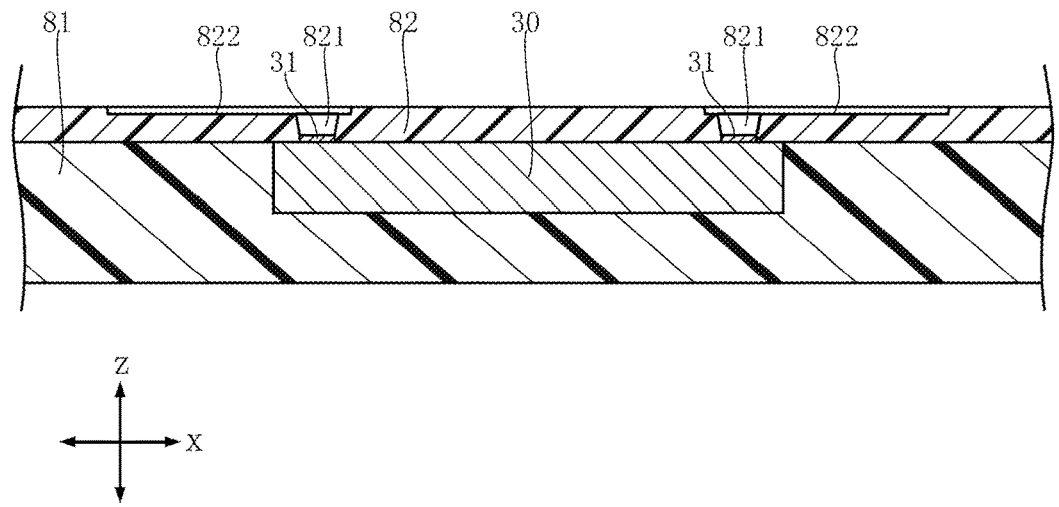
FIG. 12 is a sectional view illustrating a step of the manufacturing method for the semiconductor device shown in FIG. 1.
Figure 13:
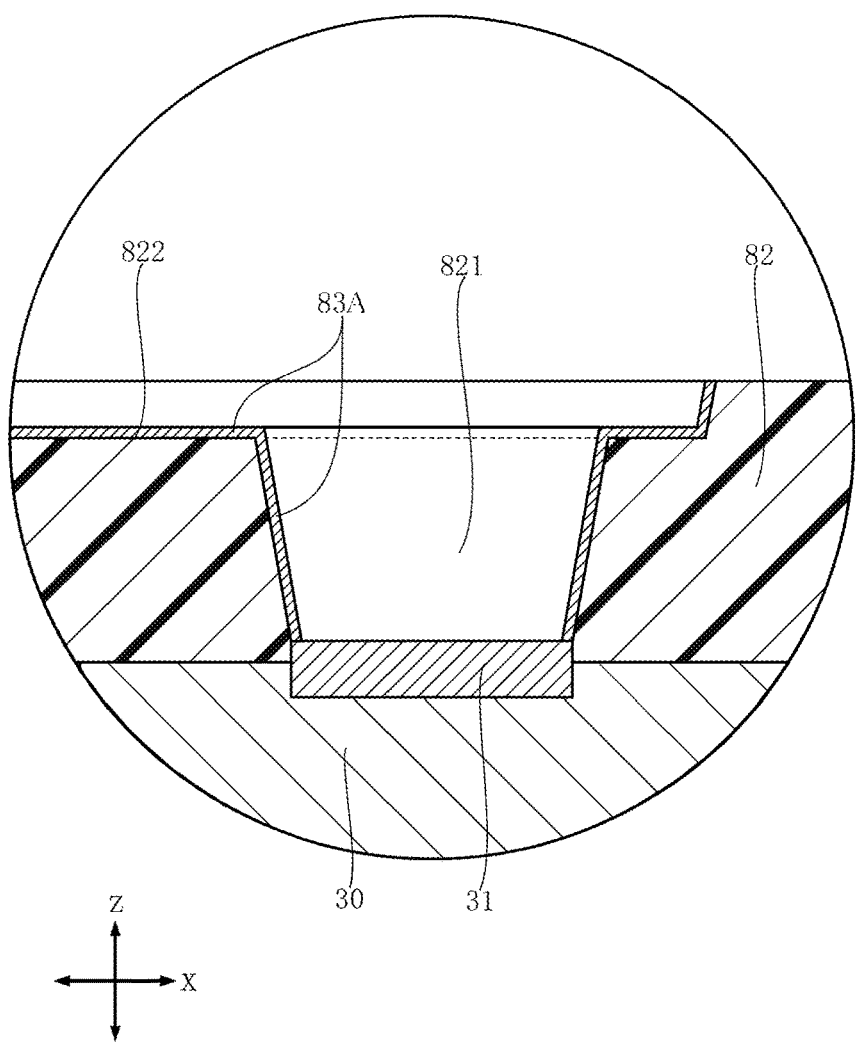
FIG. 13 is a partial enlarged view of FIG. 12.
Figure 14:
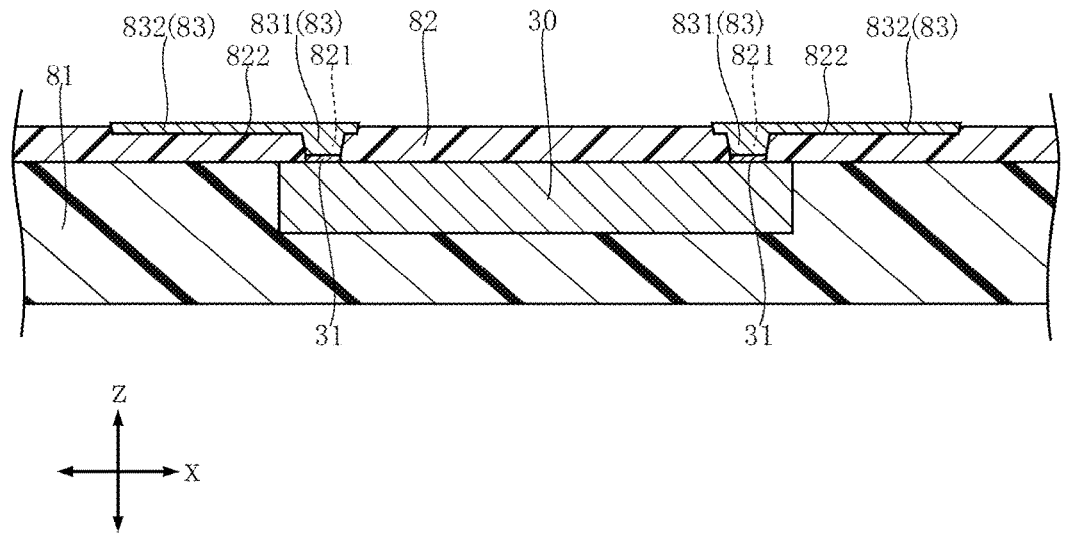
FIG. 14 is a sectional view illustrating a step of the manufacturing method for the semiconductor device shown in FIG. 1.
Figure 15:
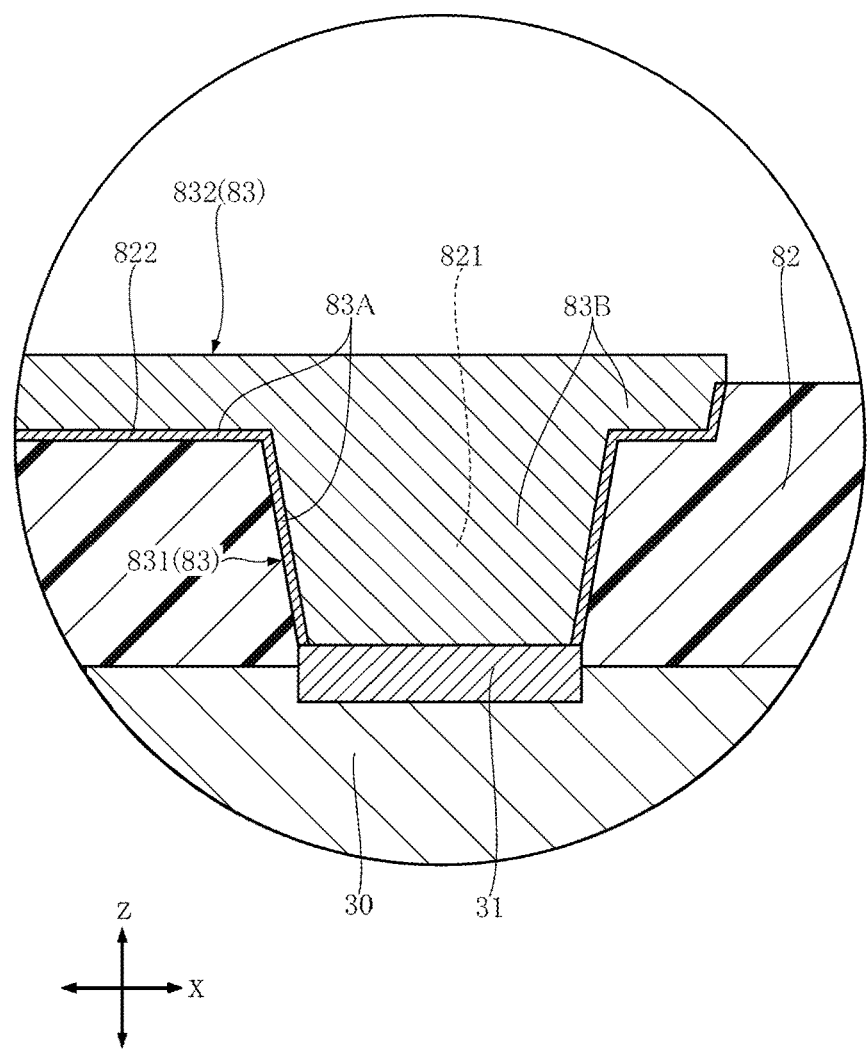
FIG. 15 is a partial enlarged view of FIG. 14.

Next, as shown in FIGS. 12-15, a plurality of conductors 83 connecting to the electrodes 31 of the semiconductor element 30 are formed. The conductors 83 correspond to the first conductors 21 of the semiconductor device A10. As shown in FIG. 14, each of the conductors 83 has an embedded part 831 and a redistribution part 832. Each embedded part 831 is embedded in the insulating layer 82 and connected to a relevant one of the electrodes 31. The redistribution parts 832 are disposed on the insulating layer 82 and connected to the embedded parts 831. As shown in FIG. 15, each of the embedded parts 831 of the conductors 83 and each of the redistribution parts 832 of the conductors 83 has a base layer 83A and a plating layer 83B. The process of forming the conductors 83 includes a step of depositing a base layer 83A covering the surface of the insulating layer 82 and a step of forming a plating layer 83B that covers the base layer 83A.

First, as shown in FIG. 13, the base layer 83A covering the surface of the insulating layer 82 is deposited. In this step, as shown in FIG. 12, a plurality of holes 821 and a plurality of grooves 822 are formed in the insulating layer 82 with a laser. The holes 821 penetrate the insulating layer 82 in the thickness direction z. The electrodes 31 of the semiconductor element 30 are individually exposed through the holes 821. The holes 821 are formed by irradiating the insulating layer 82 with a laser beam until the electrodes 31 are exposed while monitoring the positions of the electrodes 31 by image recognition using e.g. an infrared camera. The laser irradiation position is corrected based on the position information of the electrodes 31 obtained through image recognition. The grooves 822 are recessed from the surface of the insulating layer 82 and connected to the holes 821. The grooves 822 are formed by irradiating the surface of the insulating layer 82 with a laser beam. The laser beam may be an ultraviolet laser beam having a wavelength of 355 nm and a beam diameter of 17 μm, for example. As shown in FIG. 13, forming the holes 821 and the grooves 822 results in deposition of the base layer 83A that covers the wall surfaces defining the holes 821 and the grooves 822. The base layer 83A is formed of a metallic element contained in the additive that is contained in insulating layer 82. The metallic element contained in the additive is excited by laser irradiation. As a result, a metal layer containing the metallic element is deposited as the base layer 83A.

Next, as shown in FIG. 15, a plating layer 83B covering the base layer 83A is formed. The plating layer 83B is made of a material containing copper. The plating layer 83B is formed by electroless plating. In this way, an embedded part 831 is formed in each of the holes 821, as shown in FIG. 14. Also, a redistribution part 832 is formed in each of the grooves 822. A plurality of conductors 83 are formed in this way.

Figure 16:
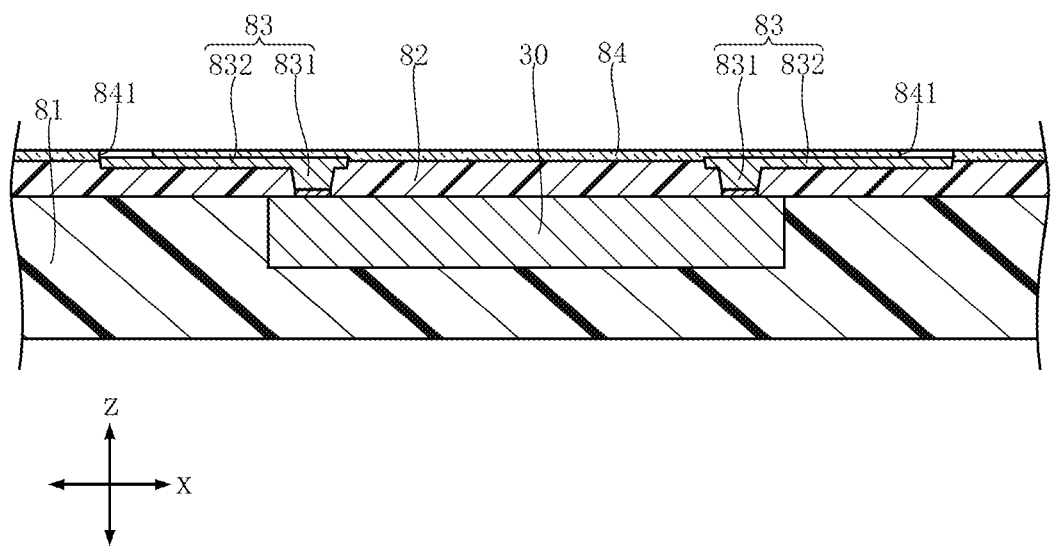
FIG. 16 is a sectional view illustrating a step of the manufacturing method for the semiconductor device shown in FIG. 1.

Next, as shown in FIG. 16, a protective layer 84 is laminated on the insulating layer 82 to cover portions of the conductors 83. The protective layer 84 has a plurality of openings 841 penetrating in the thickness direction z. Specifically, photosensitive polyimide is first applied to the surface of the insulating layer 82 and the surfaces of the conductors 83 using a spin coater. Then, photolithography patterning is performed to form openings 841 in the photosensitive polyimide. In this step, portions of the redistribution parts 832 of the conductors 83 are exposed through the openings 841. The protective layer 84 is formed in this way.

Figure 17:
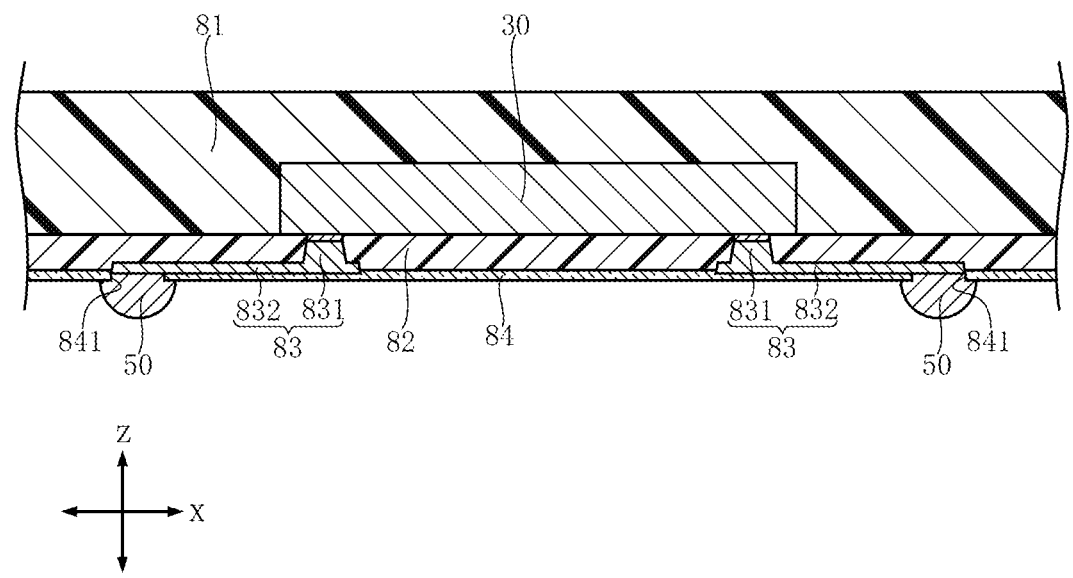
FIG. 17 is a sectional view illustrating a step of the manufacturing method for the semiconductor device shown in FIG. 1.

Next, as shown in FIG. 17, a plurality of terminals 50 are formed that are exposed through the openings 841 of the protective layer 84 and individually bonded to the redistribution parts 832 of the conductors 83. First, base parts 51 of the terminals 50 as shown in FIG. 8 are formed. The base parts 51B are formed by electroless plating. Next, bump parts 52 of the terminals 50 as shown in FIG. 8 are formed. The bump parts 52 are formed by melting a conductive material such as solder containing tin by reflowing and then solidifying by cooling. A plurality of terminals 50 are formed in this way.

Figure 18:
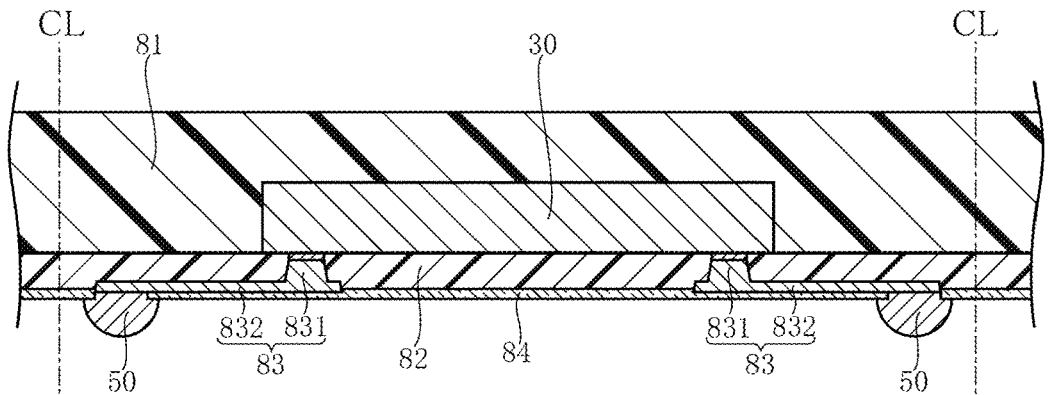
FIG. 18 is a sectional view illustrating a step of the manufacturing method for the semiconductor device shown in FIG. 1.
Figure 18:
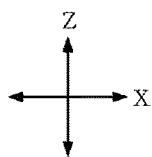

Finally, as shown in FIG. 18, the sealing resin 81, the insulating layer 82 and the protective layer 84 are cut along the cutting lines CL with e.g. a dicing blade for division into a plurality of individual pieces. The cutting is performed such that each of the individual pieces include a single semiconductor element 30 and a plurality of conductors 83 connected to the semiconductor element. The sealing resin 81, the insulating layer 82 and the protective layer 84 that are provided in each individual piece formed by this step correspond to the sealing resin 41, the first insulating layer 11 and the protective layer 42 of the semiconductor device A10. By going through the above-described steps, the semiconductor device A10 is obtained.

The advantages of the semiconductor device A10 and the method of manufacturing the semiconductor device A10 are described below.

The semiconductor device A10 includes the first insulating layer 11 having the second surface 11B, and first conductors 21 each having a first embedded part 211 and a first redistribution part 212. The first redistribution parts 212 of the first conductors 21 are disposed at the second surface 11B and connected to the first embedded parts 211 of the first conductors 21, which are connected to the electrodes 31 of the semiconductor element 30. The first insulating layer 11 has a plurality of first grooves 111 recessed from the second surface 11B in the thickness direction z. The first redistribution parts 212 of the first conductors 21 are in contact with the first grooves 111. The first grooves 111 correspond to the grooves 822 formed in the insulating layer 82 with a laser in the step of forming the conductors 83 in the method of manufacturing the semiconductor device A10.

The process of forming the conductors 83 in the method of manufacturing the semiconductor device A10 includes the step of depositing a base layer 83A on the surface of the insulating layer 82 and the step of forming a plating layer 83B covering the base layer 83A. The conductors 83 correspond to the first conductors 21 of the semiconductor device A10. The insulating layer 82 is made of a material containing a thermosetting synthetic resin and an additive that contains a metallic element that will form portions (i.e., the base layer 83A) of the conductors 83. In the step of depositing the base layer 83A, the holes 821 and the grooves 822 are formed with a laser, which causes the base layer 83A to be deposited on the wall surfaces defining the holes 821 and the grooves 822. The holes 821 are formed to expose the electrodes 31 of the semiconductor element 30 while monitoring the positions of the electrodes 31 by image recognition. Thus, even when the semiconductor element 30 has been displaced due to shrinkage of the sealing resin 81 in curing, position correction corresponding to the displacement of the electrodes 31 is performed through image recognition during the laser irradiation. Thus, the holes 821 can be formed precisely to expose the electrodes 31. Accordingly, the conductors 83 can be formed precisely at the positions of the electrodes 31. Thus, the semiconductor device A10 and the method of manufacturing the semiconductor device A10 prevent misalignment between the electrodes 31 of the semiconductor element 30 and the conductors 83 (the first conductors 21) at the joint portion.

In the step of forming the conductors 83 in the method of manufacturing the semiconductor device A10, the plating layer 83B is formed by electroless plating. Unlike the electroplating, this step does not require the deposition of the base layer 83A as a conduction path for plating, so that the conductors 83 can be formed efficiently.

Each of the first redistribution parts 212 of the first conductors 21 has a base layer 21A in contact with a relevant one of the first grooves 111 and a plating layer 21B covering the base layer 21A. Each plating layer 21B has a recess 212A that is recessed in the thickness direction z. The recess 212A is a trace resulting from the step of forming the conductors 83 in the method of manufacturing the semiconductor device A10 as a result of forming the plating layer 83B on the base layer 83A covering the grooves 822. Thus, each recess 212A extends along the direction in which the relevant one of the first redistribution parts 212 of the first conductors 21 extends.

The semiconductor device A10 further includes the protective layer 42 in contact with the second surface 11B of the first insulating layer 11 and a plurality of terminals 50. The terminals 50 are individually connected to portions of the first redistribution parts 212 of the first conductors 21 that are exposed through the openings 421 of the protective layer 42. The terminals 50 project from the protective layer 42 in the thickness direction z. The terminals 50 are made of a material containing tin. Such a configuration facilitates the mounting of the semiconductor device A10 to a wiring board.

Second Embodiment

A semiconductor device A20 according to a second embodiment of the present disclosure is described below with reference to FIGS. 19-26. In these figures, the elements that are the same as or similar to those of the semiconductor device A10 are denoted by the same reference signs as those used for the semiconductor device A10, and the descriptions thereof are omitted.

Figure 19:
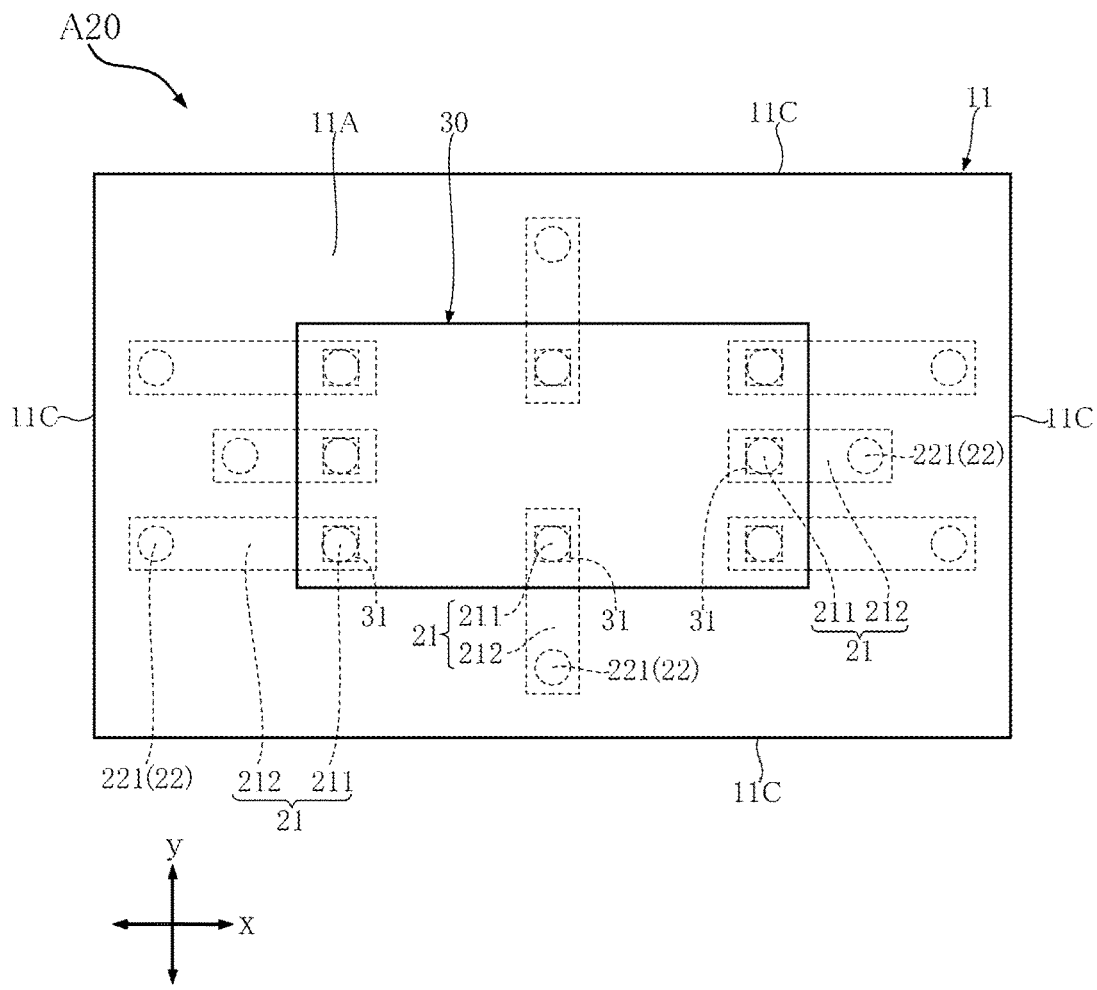
FIG. 19 is a plan view of a semiconductor device according to a second embodiment of the present disclosure, as seen through a sealing resin.
Figure 20:
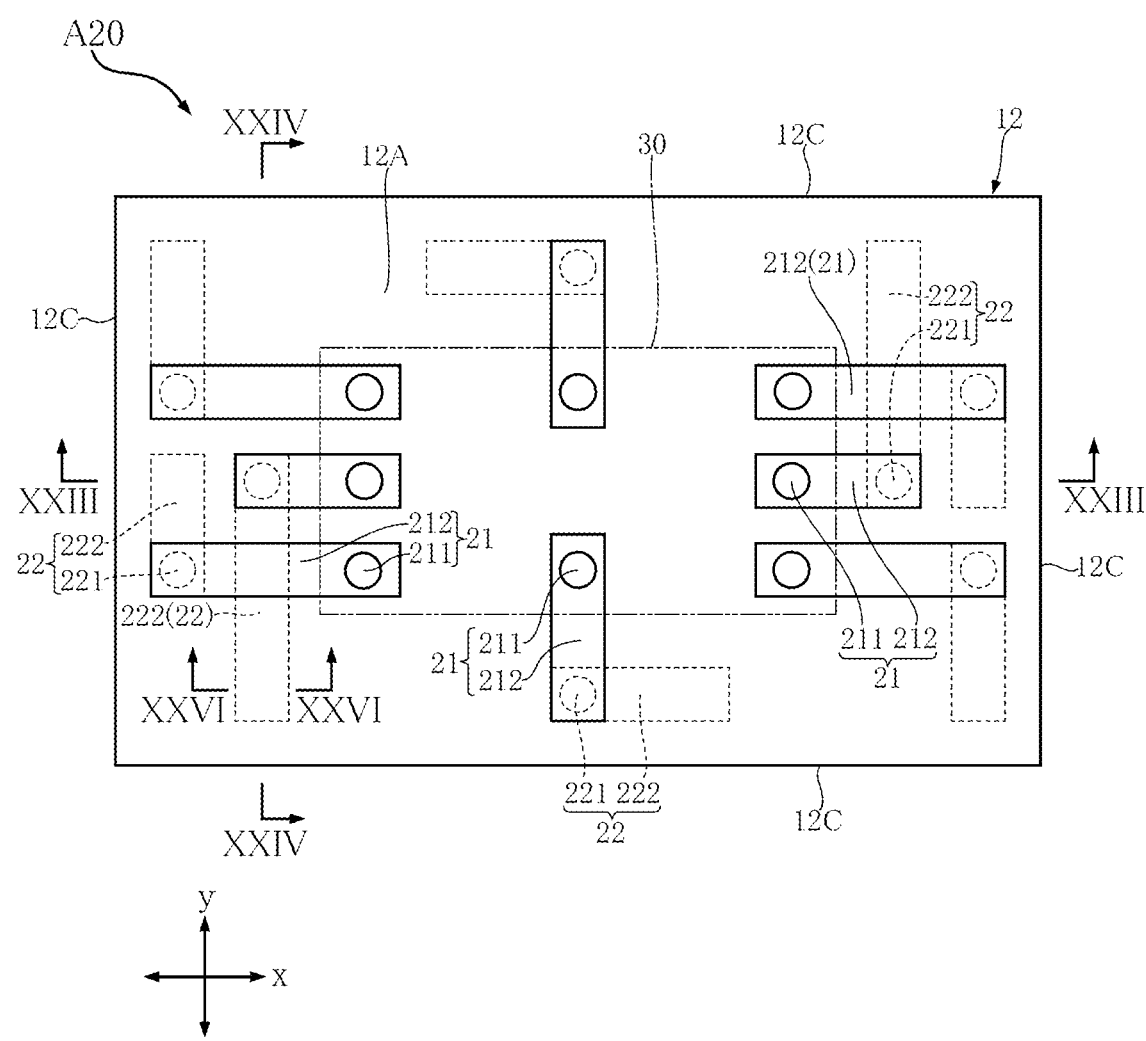
FIG. 20 is a plan view corresponding to FIG. 19, in which a first insulating layer and a semiconductor element are illustrated as transparent.
Figure 22:
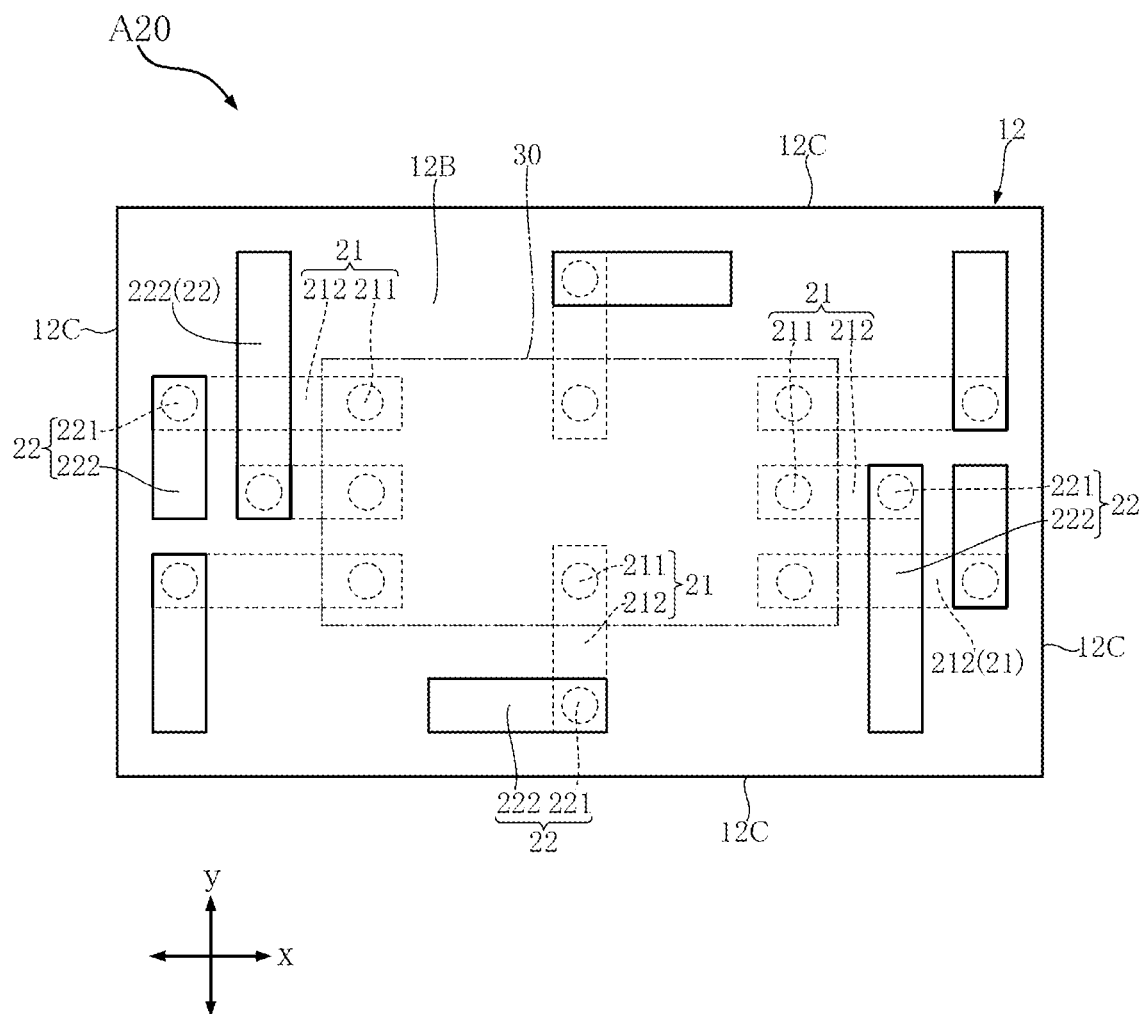
FIG. 22 is a bottom view corresponding to FIG. 21, as seen through a protective layer and a plurality of terminals.

The semiconductor device A20 differs from the semiconductor device A10 in that the semiconductor device A20 further includes a second insulating layer 12 and a plurality of second conductors 22 and in configurations of the protective layer 42 and the terminals 50. In FIG. 19, the sealing resin 41 is illustrated as transparent for convenience of understanding. FIG. 20 corresponds to FIG. 19, but the first insulating layer 11 and the semiconductor element 30 are also illustrated as transparent for convenience of understanding. In FIG. 22, the protective layer 42 and the terminals 50 are illustrated as transparent for convenience of understanding. In FIG. 20, the outline of the semiconductor element 30, which is illustrated as transparent, is shown by imaginary lines.

Figure 23:
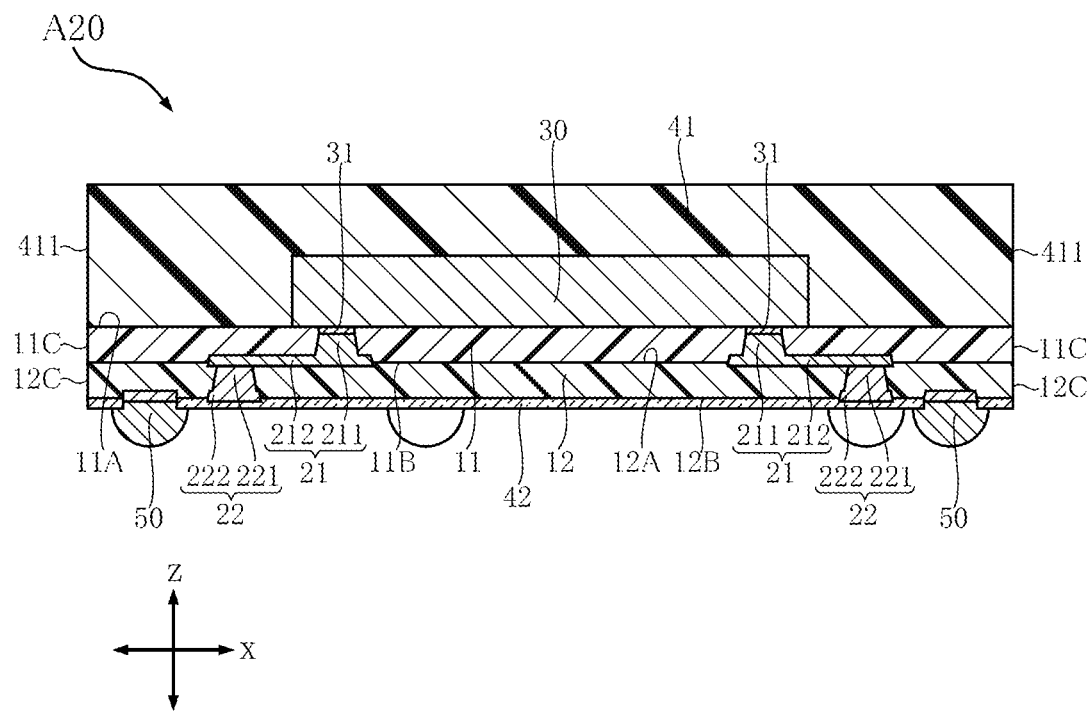
FIG. 23 is a sectional view taken along line XXIII-XXIII in FIG. 20.
Figure 24:
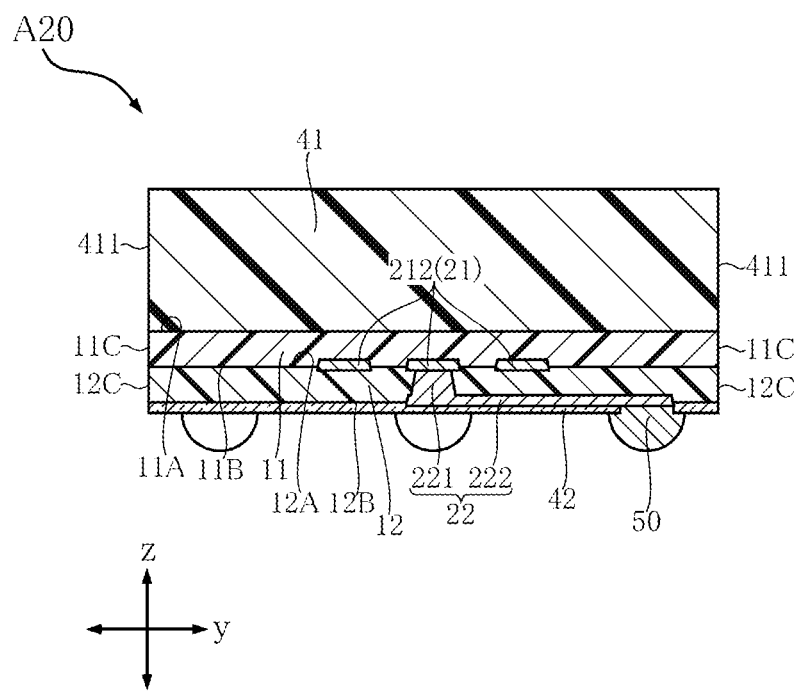
FIG. 24 is a sectional view taken along line XXIV-XXIV in FIG. 20.

As shown in FIGS. 23 and 24, the second insulating layer 12 is in contact with the second surface 11B of the first insulating layer 11. Thus, the first insulating layer 11 is sandwiched between the second insulating layer 12 and the sealing resin 41. The second insulating layer 12 is made of a material containing a thermosetting synthetic resin and an additive that contains a metallic element forming portions of the second conductors 22. The synthetic resin may be an epoxy resin or a polyimide resin, for example. The second insulating layer 12 has a third surface 12A, a fourth surface 12B and a plurality of end surfaces 12C. The third surface 12A and the fourth surface 12B face away from each other in the thickness direction z. The third surface 12A is in contact with the second surface 11B. When the semiconductor device A20 is mounted on a wiring board, the fourth surface 12B faces the wiring board. The end surfaces 12C are connected to both the third surface 12A and the fourth surface 12B. Each of the end surfaces 12C faces either the first direction x or the second direction y. Each of the end surfaces 12C is flush with both of one of the end surfaces 11C of the first insulating layer 11 and one of the side surfaces 411 of the sealing resin 41.

Figure 25:
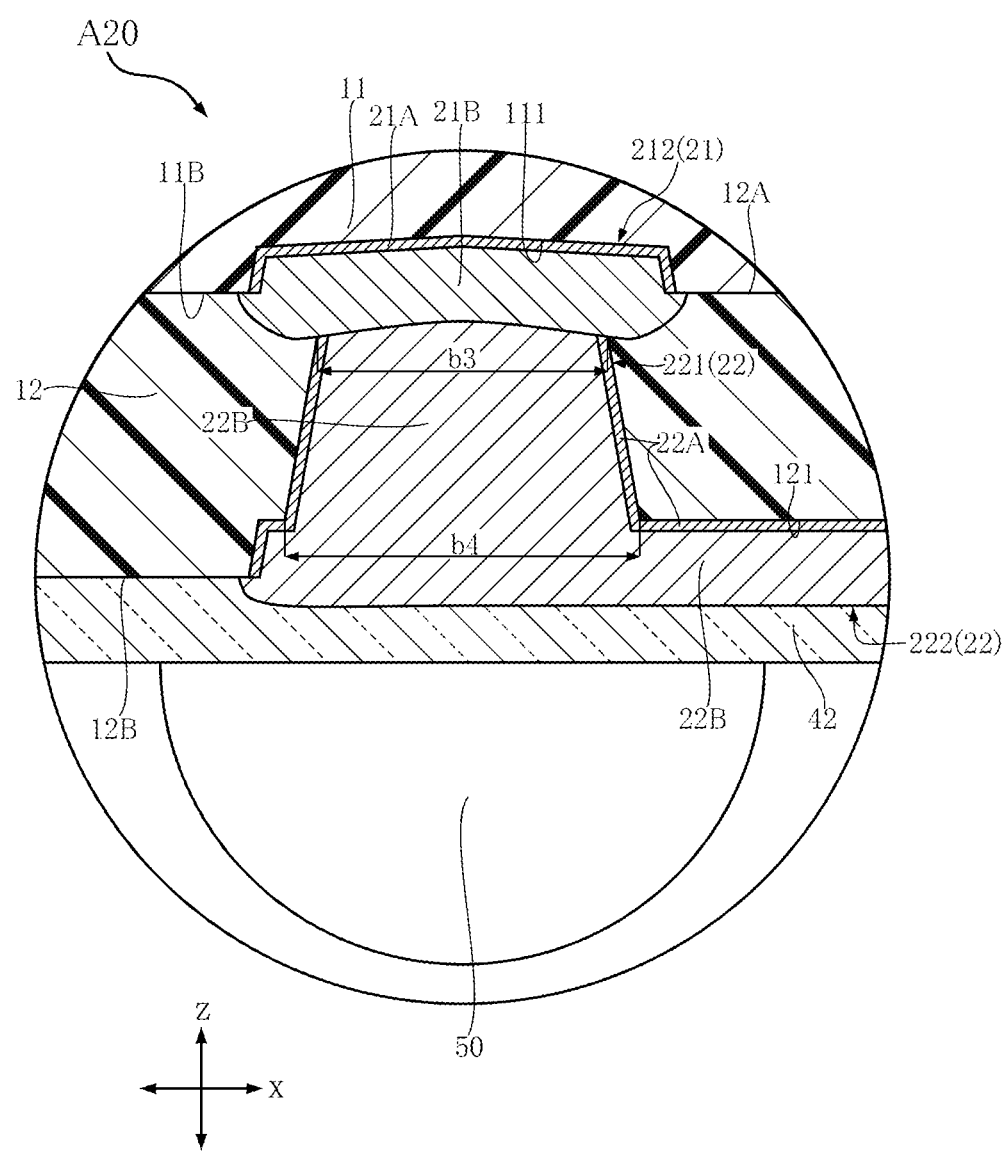
FIG. 25 is a partial enlarged view of FIG. 23.
Figure 26:
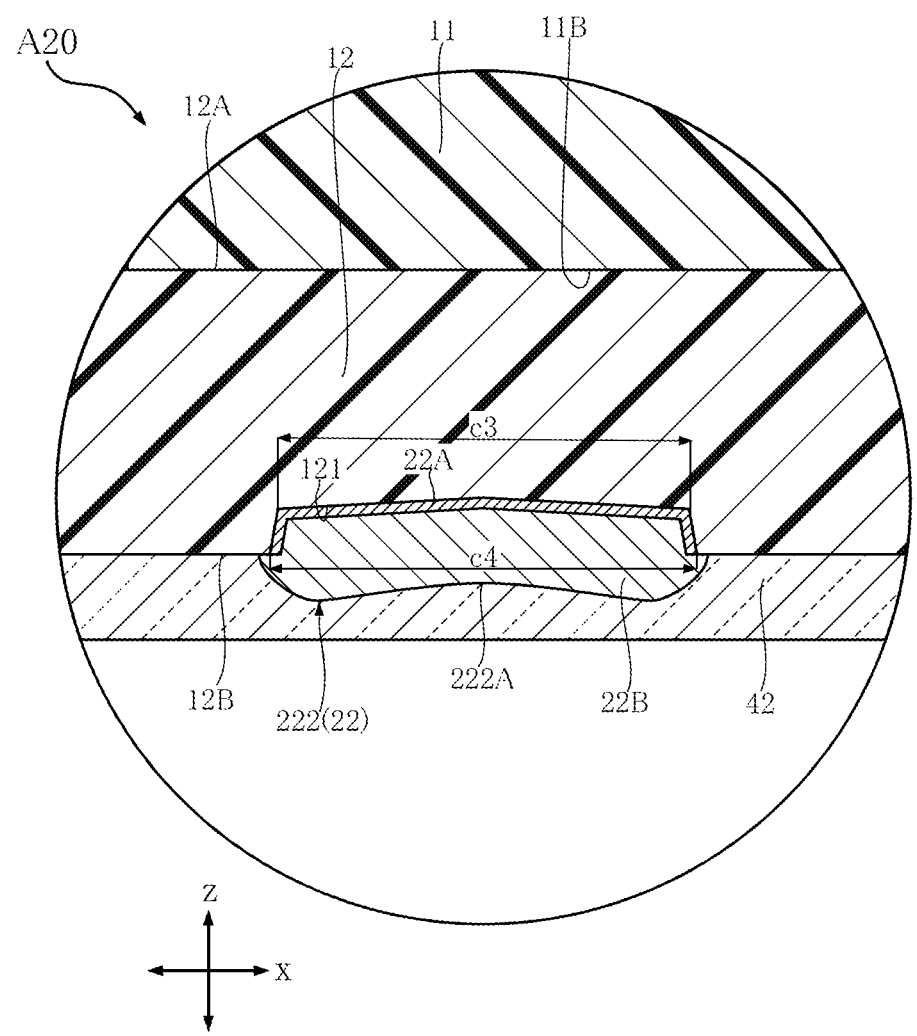
FIG. 26 is a partial enlarged sectional view taken along line XXVI-XXVI in FIG. 20.

As shown in FIGS. 25 and 26, the second insulating layer 12 has a plurality of second grooves 121. The second grooves 121 are recessed from the fourth surface 12B in the thickness direction z. As shown in FIG. 26, the side surfaces of each of the second grooves 121 are flared in the thickness direction z from the bottom surface of the second groove 121 toward the fourth surface 12B. In each of the second grooves 121, the dimension c3 of the bottom surface of the second groove 121 in the first direction x is smaller than the dimension c4 between the two boundaries between the second groove 121 and the fourth surface 12B, which are spaced apart from each other in the first direction x.

As shown in FIGS. 23 and 24, the second conductors 22 are disposed in the second insulating layer 12. The second conductors 22, along with the first conductors 21, form a conduction path for the semiconductor element 30. Each of the second conductors 22 has a second embedded part 221 and a second redistribution part 222. The second embedded parts 221 are embedded in the second insulating layer 12. As shown in FIG. 25, each second embedded part 221 has a side surface that is flared in the thickness direction z from the third surface 12A toward the fourth surface 12B of the second insulating layer 12. The dimension b3 in the direction orthogonal to the thickness direction z of the end surface of the second embedded part 221 that is closest to the third surface 12A is smaller than the dimension b4 in the direction orthogonal to the thickness direction z of the end surface of the second embedded part 221 that is closest to the fourth surface 12B. The second redistribution parts 222 are disposed at the fourth surface 12B of the second insulating layer 12. The second redistribution parts 222 are connected to the first redistribution parts 212. The second redistribution parts 222 of the second conductors 22 are in contact with the second grooves 121 of the second insulating layer 12. That is, portions of the second redistribution parts 222 of the second conductors 22 are embedded in the second grooves 121.

As shown in FIGS. 23 and 24, the second embedded parts 221 of the second conductors 22 are connected to the first redistribution parts 212 of the first conductors 21. Thus, the semiconductor element 30 is electrically connected to the second conductors 22 via the first conductors 21. The second redistribution parts 221 of the second conductors 22 are covered with the second insulating layer 12. As shown in FIGS. 20 and 22, as viewed in the thickness direction z, the second redistribution parts 222 of the second conductors 22 include portions that overlap with the first redistribution parts 212 of the first conductors 21.

As shown in FIG. 25, each of the second embedded parts 221 of the second conductors 22 and each of the second redistribution parts 222 of the second conductors 22 has a base layer 22A and a plating layer 22B. The base layers 22A are made of a metallic element contained in the additive that is contained in the second insulating layer 12. The plating layers 22B may be made of a material containing copper, for example. The base layers 22A of the second embedded parts 221 are in contact with the second insulating layer 12. The plating layer 22B of each second embedded part 221 is surrounded by the base layer 22A of the second embedded part 221 around the thickness direction z. The base layer 22A of each second redistribution part 222 is in contact with a relevant one of the second grooves 121 of the second insulating layer 12. The plating layer 22B of each second redistribution part 222 covers the base layer 22A of the second redistribution part 222. As shown in FIG. 26, the plating layer 22B of each second redistribution part 222 has a recess 222A that is recessed in the thickness direction z. The recess 222A extends along the direction in which the second redistribution part 222 of the second conductor 22 extends.

Figure 21:
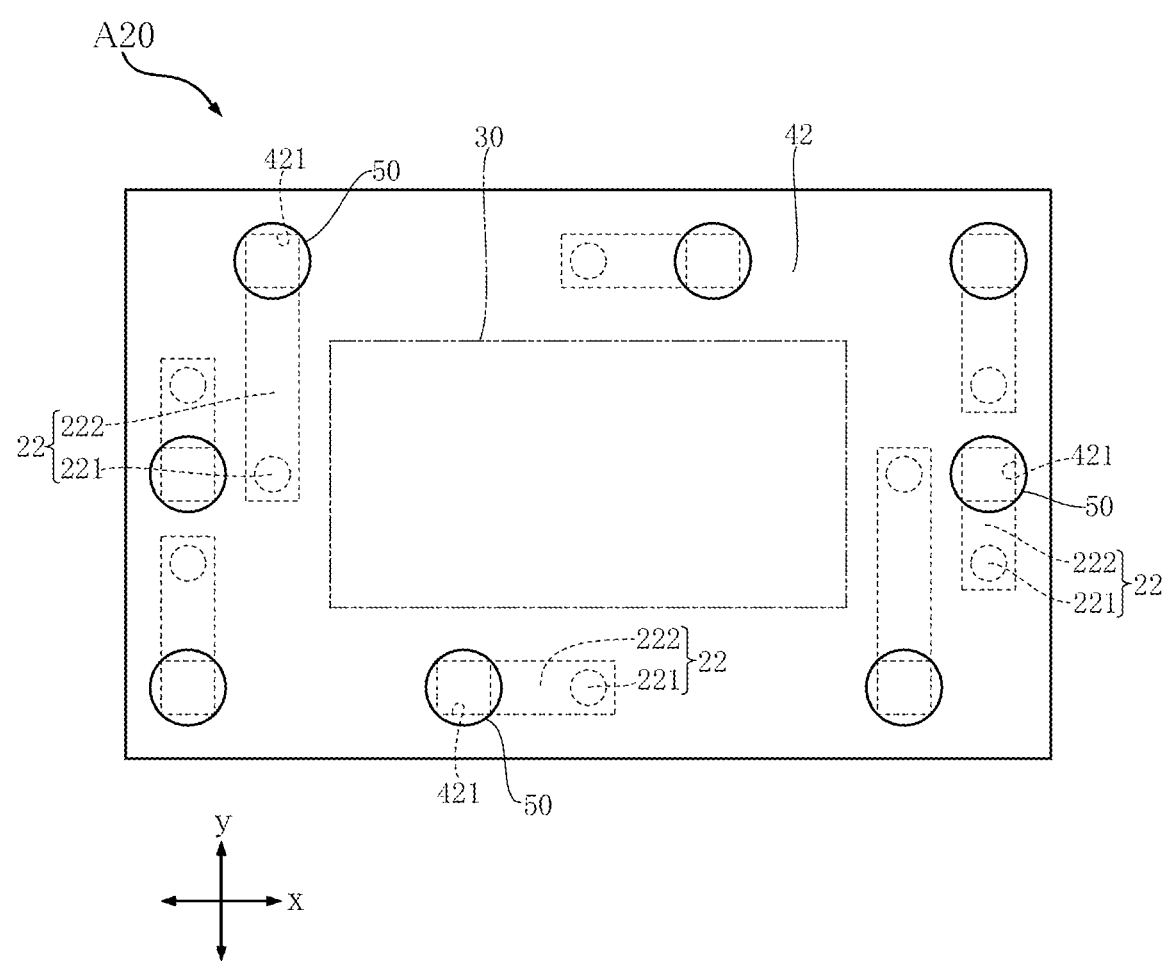
FIG. 21 is a bottom view of the semiconductor device shown in FIG. 19.

As shown in FIGS. 23 and 24, the protective layer 42 is in contact with the fourth surface 12B of the second insulating layer 12. The second redistribution parts 222 of the second conductors 22 are covered with the protective layer 42. Portions of the second redistribution parts 222 of the second conductors 22 are exposed through the openings 421 of the protective layer 42. As shown in FIGS. 21 and 25, the terminals 50 are individually bonded to the portions of the second redistribution parts 222 of the second conductors 22 that are exposed through the openings 421.

The advantages of the semiconductor device A20 are described below.

The semiconductor device A20 includes the first insulating layer 11 having the second surface 11B, and first conductors 21 each having a first embedded part 211 and a first redistribution part 212. The first redistribution parts 212 of the first conductors 21 are disposed at the second surface 11B and connected to the first embedded parts 211 of the first conductors 21, which are connected to the electrodes 31 of the semiconductor element 30. The first insulating layer 11 has a plurality of first grooves 111 recessed from the second surface 11B in the thickness direction z. The first redistribution parts 212 of the first conductors 21 are in contact with the first grooves 111. Thus, the semiconductor device A20 also prevents misalignment between the electrodes 31 of the semiconductor element 30 and the first conductors 21 at the joint portion.

The semiconductor device A20 further includes the second insulating layer 12 having the third surface 12A and the fourth surface 12B, and second conductors 22 each having a second embedded part 221 and a second redistribution part 222. The third surface 12A is in contact with the second surface 11B of the first insulating layer 11. The second redistribution parts 222 of the second conductors 22 are disposed at the fourth surface 12B and connected to the second embedded parts 221 of the second conductors 22 that are embedded in the second insulating layer 12. The first redistribution parts 212 of the first conductors 21 are connected to the second embedded parts 221 of the second conductors 22 and covered with the second insulating layer 12. Thus, in the semiconductor device A20, the first conductors 21 and the second conductors 22 are stacked in the thickness direction z. Thus, as viewed in the thickness direction z, the second redistribution parts 222 of the second conductors 22 overlap with the first redistribution parts 212 of the first conductors 21. In this way, the semiconductor device A20 realizes a more complicated wiring pattern than that of the semiconductor device A10.

Third Embodiment

A semiconductor device A30 according to a third embodiment of the present disclosure is described below with reference to FIGS. 27-32. In these figures, the elements that are the same as or similar to those of the semiconductor device A10 are denoted by the same reference signs as those used for the semiconductor device A10, and the descriptions thereof are omitted.

Figure 27:
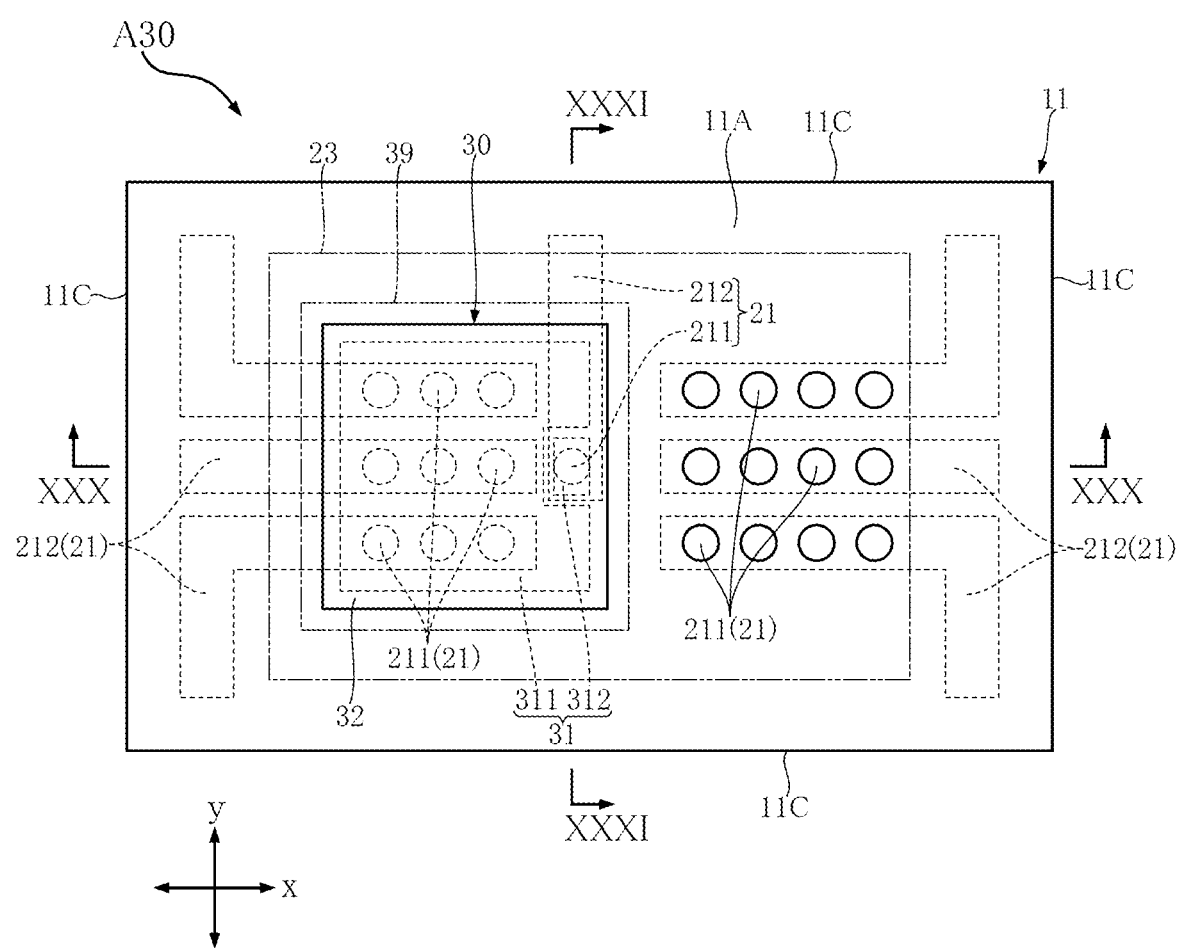
FIG. 27 is a plan view of a semiconductor device according to a third embodiment of the present disclosure, as seen through a heat dissipator, a bonding layer and a sealing resin.
Figure 28:
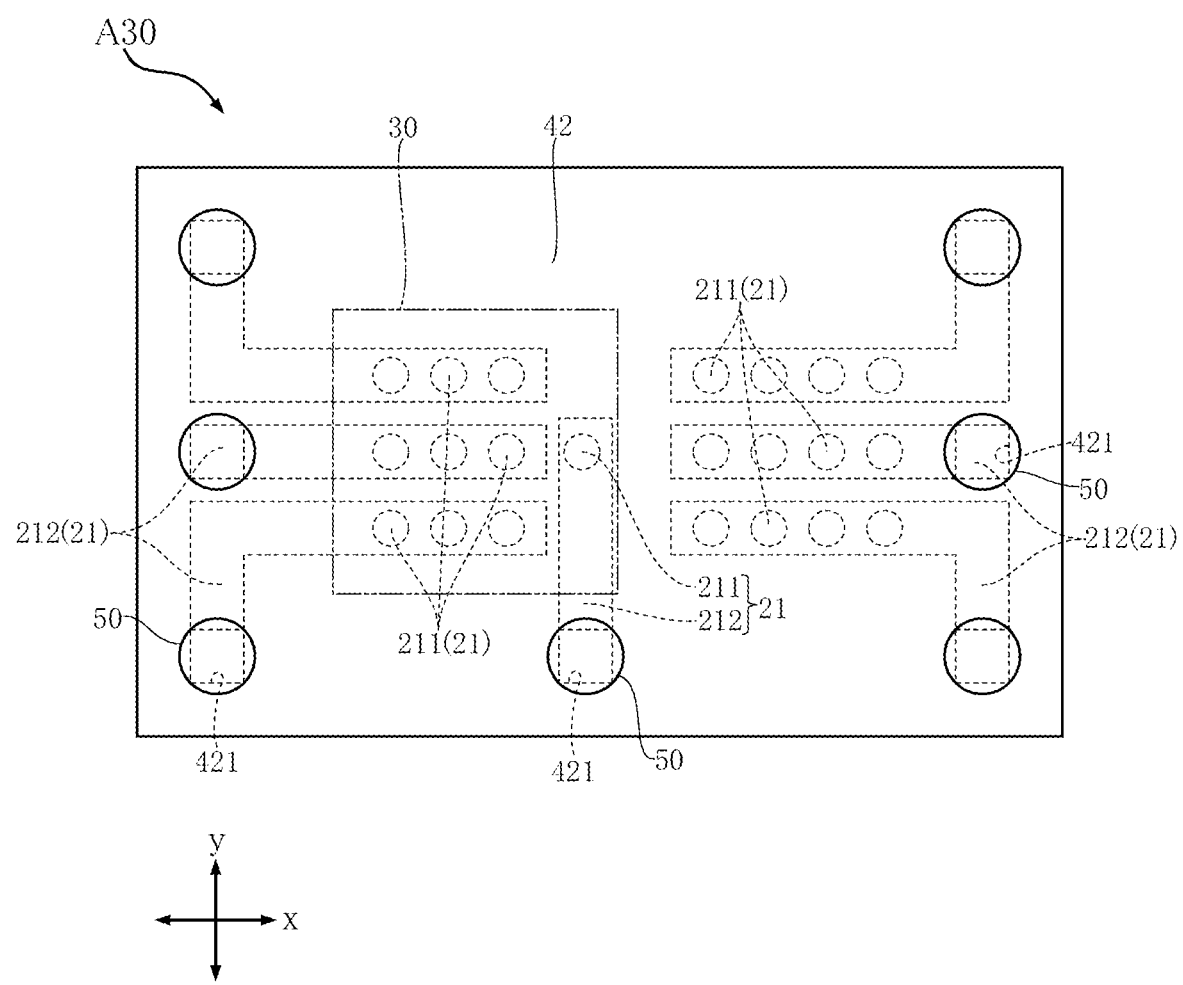
FIG. 28 is a bottom view of the semiconductor device shown in FIG. 27.
Figure 29:
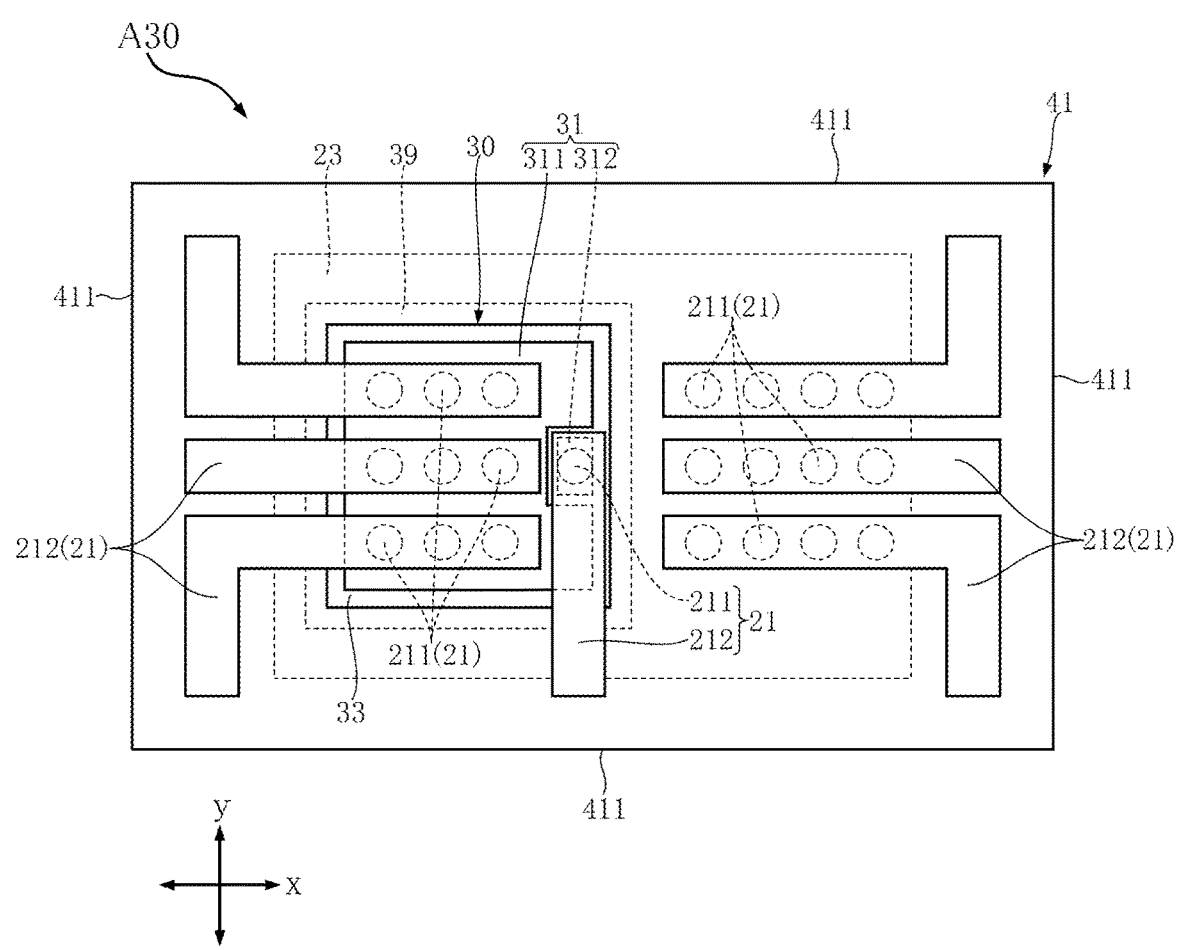
FIG. 29 is a bottom view corresponding to FIG. 28, as seen through a first insulating layer, a protective layer and a plurality of terminals.

The semiconductor device A30 differs from the semiconductor device A10 in that the semiconductor device A30 further includes a heat dissipator 23 and a bonding layer 39 and in configurations of the first embedded parts 211 of the first conductors 21 and the semiconductor element 30. In FIG. 27, the heat dissipator 23, the bonding layer 39 and the sealing resin 41 are illustrated as transparent for convenience of understanding. In FIG. 29, the first insulating layer 11, the protective layer 42 and the terminals 50 are illustrated as transparent for convenience of understanding. In FIG. 27, the respective outlines of the heat dissipator 23 and the bonding layer 39, which are illustrated as transparent, are shown by imaginary lines.

In the semiconductor device A30, the semiconductor element 30 is a switching element such as a MOSFET (Metal-Oxide-Semiconductor Field-Effect Transistor). Thus, the semiconductor device A30 can be used for e.g. DC/DC converters or inverters of various electric appliances.

Figure 30:
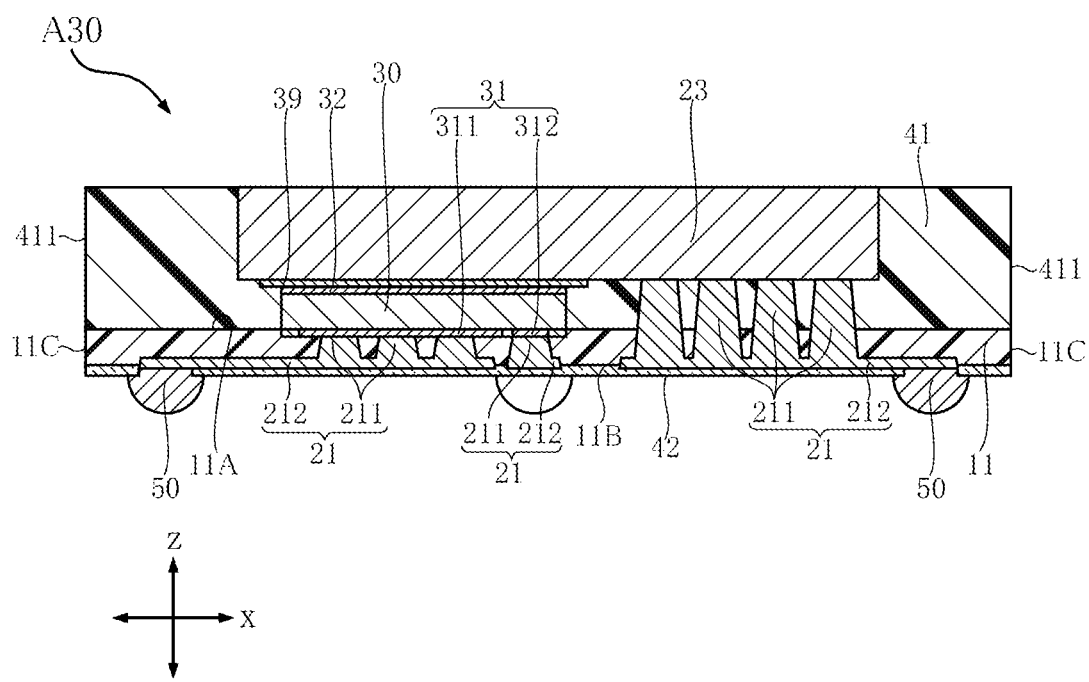
FIG. 30 is a sectional view taken along line XXX-XXX in FIG. 27.
Figure 31:
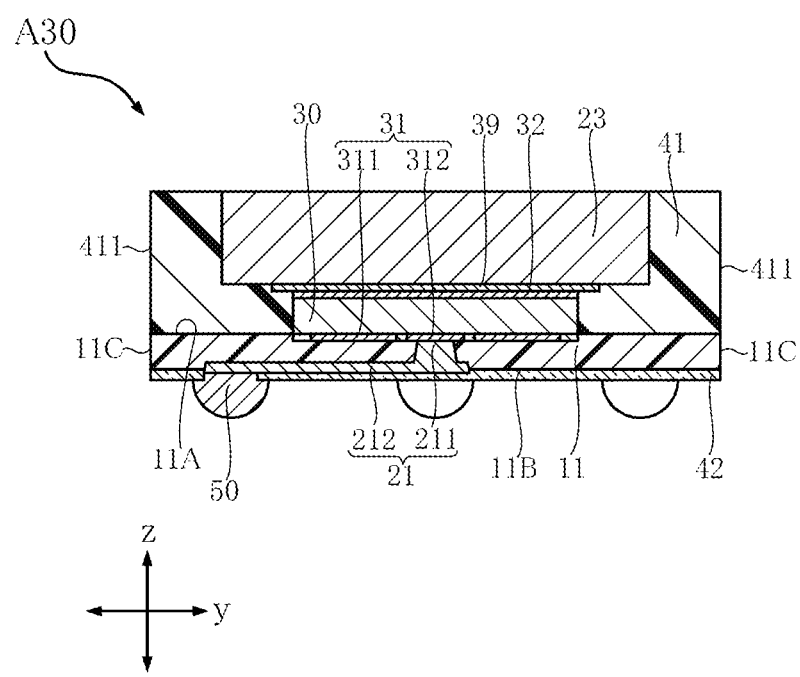
FIG. 31 is a sectional view taken along line XXXI-XXXI in FIG. 27.

As shown in FIGS. 30 and 31, the heat dissipator 23 is located on the opposite side of the first insulating layer 11 with respect to the semiconductor element 30 in the thickness direction z. At least a portion of the heat dissipator 23 is covered with the sealing resin 41. The heat dissipator 23 is a metal plate containing copper, for example. The heat dissipator 23 dissipates the heat generated from the semiconductor element 30 during the use of the semiconductor device A30 and also forms a conduction path for the semiconductor element 30, along with the first conductors 21.

In the semiconductor device A30, the semiconductor element 30 may be a MOSFET made from a semiconductor material mainly composed of silicon carbide (SiC), for example. The semiconductor element 30 is not limited to a MOSFET and may be a field effect transistor including a MISFET (Metal-Insulator-Semiconductor Field-Effect Transistor) or a bipolar transistor such as an IGBT (Insulated Gate Bipolar Transistor). In the description of the semiconductor device A30, it is assumed that the semiconductor element 30 is an N-channel MOSFET.

As shown in FIGS. 27 and 29-32, the electrodes 31 of the semiconductor element 30 include a front surface electrode 311 and a gate electrode 312. As viewed in the thickness direction z, the area of the front surface electrode 311 is larger than that of the gate electrode 312. To the front surface electrode 311, a source current flows from inside the semiconductor element 30. To the gate electrode 312, a gate voltage for driving the semiconductor element 30 is applied.

Figure 32:
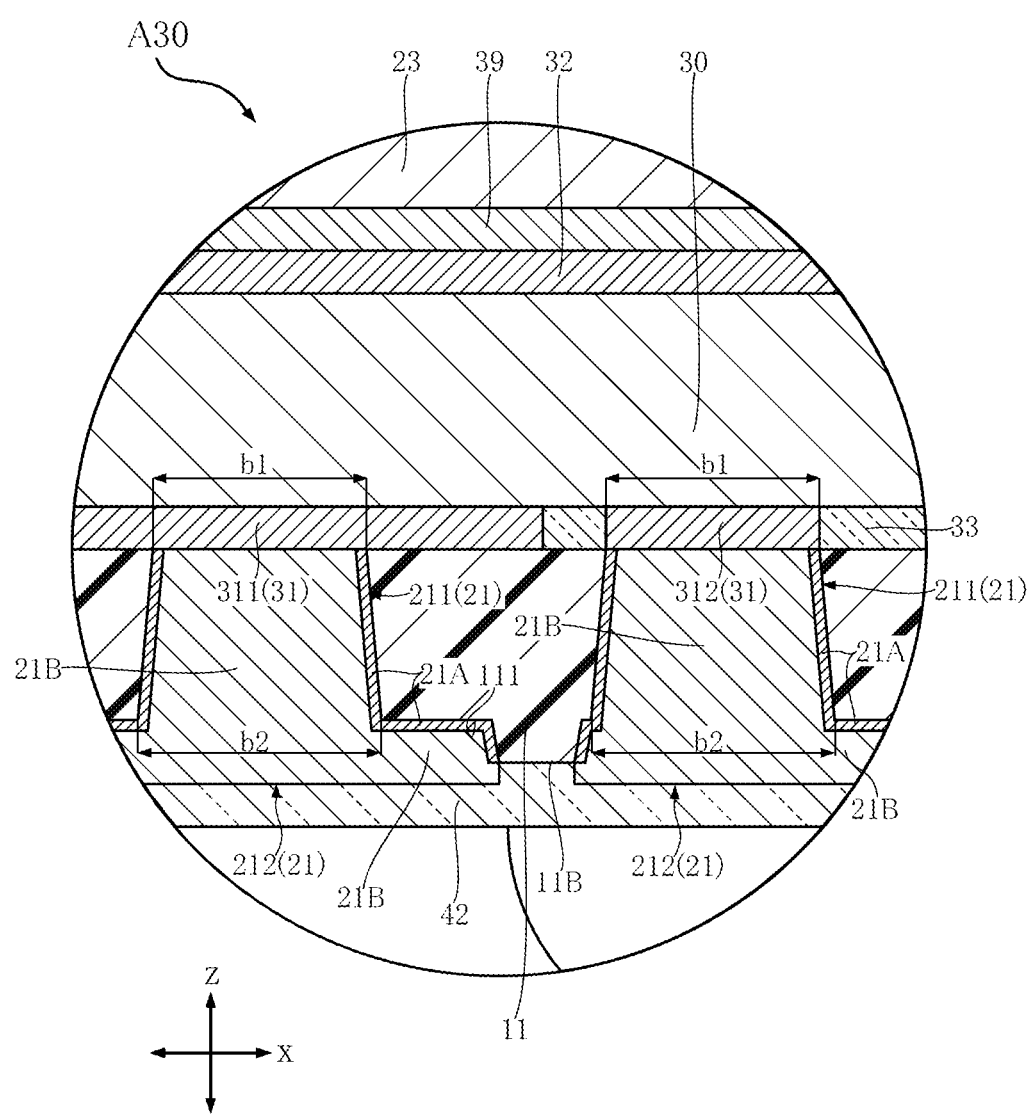
FIG. 32 is a partial enlarged view of FIG. 30.

As shown in FIG. 32, the semiconductor element 30 has a back surface electrode 32 and an insulating film 33. As shown in FIGS. 30-32, the back surface electrode 32 is located farther from the first surface 11A of the first insulating layer 11 than are the front surface electrode 311 and the gate electrode 312. The back surface electrode 32 faces the heat dissipator 23. The back surface electrode 32 is provided on the entirety of the surface of the semiconductor element 30 that faces the heat dissipator 23. A drain current flows through the back surface electrode 32 toward the inside of the semiconductor element 30.

As shown in FIG. 32, as with the front surface electrode 311 and the gate electrode 312, the insulating film 33 is provided near the first surface 11A of the first insulating layer 11. As shown in FIG. 29, as viewed in the thickness direction z, the insulating film 33 surrounds each of the front surface electrode 311 and the gate electrode 312. The insulating film 33 may be provided by laminating layers in the order of a silicon dioxide ($SiO_2$) layer, a silicon nitride ($Si_3N_4$) layer and a polybenzoxazole (PBO) layer in the direction toward the first surface 11A in the thickness direction z. The insulating film 33 may include a polyimide layer instead of a polybenzoxazole layer.

As shown in FIGS. 30-32, the bonding layer 39 is interposed between the back surface electrode 32 of the semiconductor element 30 and the heat dissipator 23. The bonding layer 39 may be lead-free solder mainly composed of tin or baked silver, for example. Thus, the back surface electrode 32 is bonded to the heat dissipator 23. The heat dissipator 23 is electrically connected to the back surface electrode 32 via the bonding layer 39.

As shown in FIG. 30, some of the first embedded parts 211 of the first conductors 21 are embedded in the first insulating layer 11, while others are embedded in both the first insulating layer 11 and the sealing resin 41. The first embedded parts 211 of the first conductors 21 that are embedded in the first insulating layer 11 are connected to the electrodes 31 (the front surface electrode 311 and the gate electrode 312) of the semiconductor element 30. The first embedded parts 211 of the first conductors 21 that are embedded in both the first insulating layer 11 and the sealing resin 41 are bonded to the heat dissipator 23.

The advantages of the semiconductor device A30 are described below.

The semiconductor device A30 includes the first insulating layer 11 having the second surface 11B, and first conductors 21 each having a first embedded part 211 and a first redistribution part 212. The first redistribution parts 212 of the first conductors 21 are disposed at the second surface 11B and connected to the first embedded parts 211 of the first conductors 21, which are connected to the electrodes 31 of the semiconductor element 30. The first insulating layer 11 has a plurality of first grooves 111 recessed from the second surface 11B in the thickness direction z. The first redistribution parts 212 of the first conductors 21 are in contact with the first grooves 111. Thus, the semiconductor device A30 also prevents misalignment between the electrodes 31 of the semiconductor element 30 and the first conductors 21 at the joint portion.

The semiconductor device A30 further includes the heat dissipator 23 located on the opposite side of the first insulating layer 11 with respect to the semiconductor element 30. The back surface electrode 32 of the semiconductor element 30 and some of the first embedded parts 211 of the first conductors 21 are bonded to the heat dissipator 23. With such an arrangement, when the semiconductor element 30 is an N-channel MOSFET, the heat dissipator 23 forms a conduction path of the semiconductor element 30 for the drain current to flow. Also, during the use of the semiconductor device A30, the heat generated from the semiconductor element 30 is efficiently dissipated to the outside.

Fourth Embodiment

A semiconductor device A40 according to a fourth embodiment of the present disclosure is described below with reference to FIGS. 33-35. In these figures, the elements that are the same as or similar to those of the semiconductor device A10 are denoted by the same reference signs as those used for the semiconductor device A10, and the descriptions thereof are omitted.

The semiconductor device A40 differs from the semiconductor device A10 in that the semiconductor device A40 further includes a plurality of through conductors 24 and a light-transmitting resin 43 and in configurations of the semiconductor element 30 and the terminals 50. The semiconductor device A40 is not provided with the protective layer 42. In FIG. 33, the light-transmitting resin 43 is illustrated as transparent for convenience of understanding. FIG. 34 corresponds to FIG. 33, but the first insulating layer 11 and the first conductors 21 are also illustrated as transparent for convenience of understanding. In FIG. 34, the outline of the first insulating layer 11, which is illustrated as transparent, is shown by imaginary lines.

Figure 33:
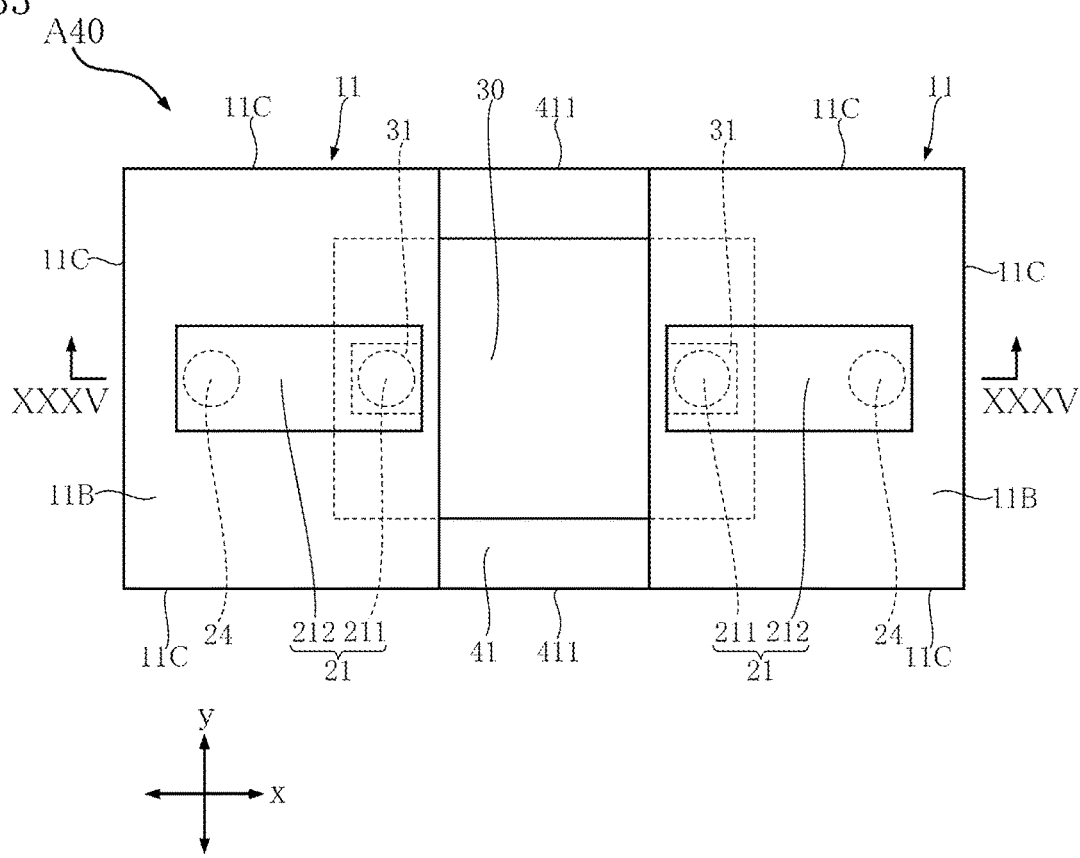
FIG. 33 is a plan view of a semiconductor device according to a fourth embodiment of the present disclosure, as seen through a sealing resin.
Figure 34:
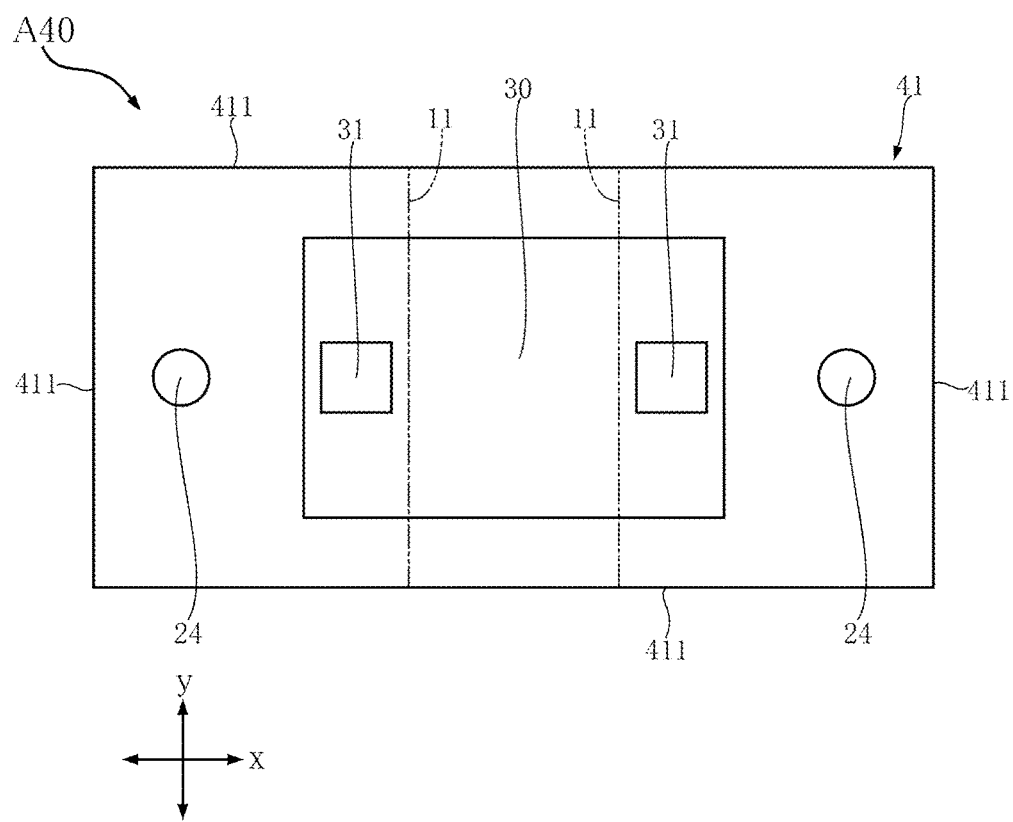
FIG. 34 is a plan view corresponding to FIG. 33, in which a first insulating layer and a plurality of first conductors are illustrated as transparent.
Figure 35:
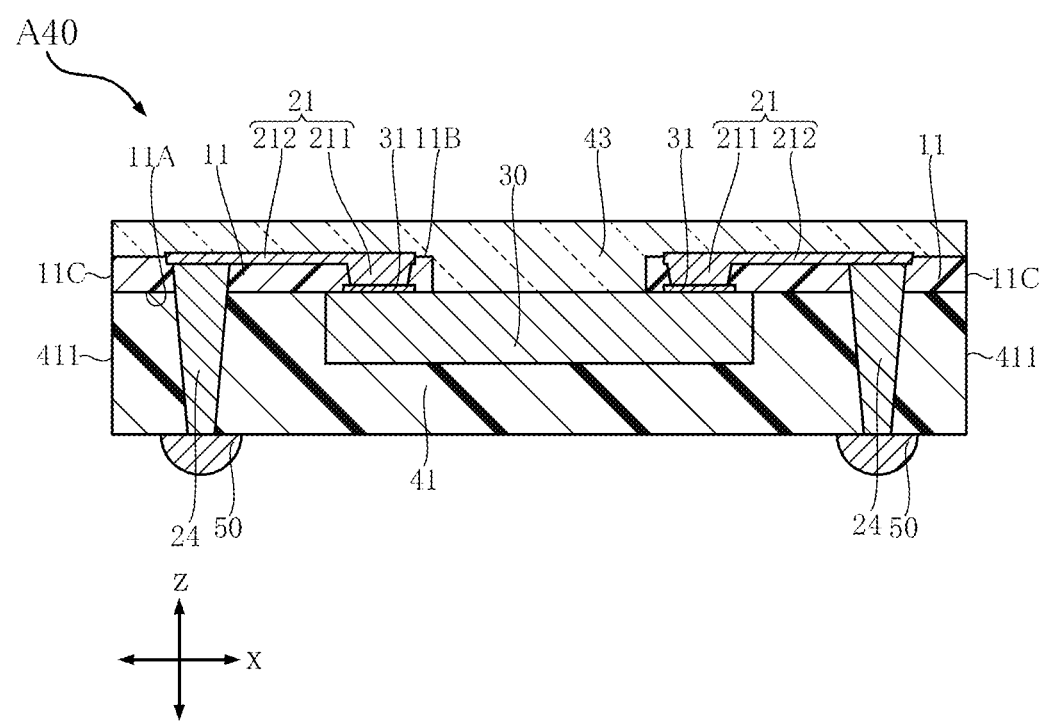
FIG. 35 is a sectional view taken along line XXXV-XXXV in FIG. 33.

As shown in FIGS. 33-35, the first insulating layer 11 includes portions spaced apart from each other in the first direction x. Thus, the semiconductor element 30 includes a portion that is not covered with the first insulating layer 11. The semiconductor element 30 of the semiconductor device A40 is an optical element configured to emit light from this portion. In the example of the semiconductor device A40, the optical element is an LED. When a voltage is applied to the electrodes 31 of the semiconductor element 30, light is emitted from the above-mentioned portion in the thickness direction z.

As shown in FIGS. 33 and 34, the through conductors 24 are located outside the semiconductor element 30 as viewed in the thickness direction z. As shown in FIG. 35, the through conductors 24 are connected to the first redistribution parts 212 of the first conductors 21. The through conductors 24 extend from the first redistribution parts 212 of the first conductors 21 in the thickness direction z and penetrate the sealing resin 41. The through conductors 24 are made of a material containing copper, for example.

As shown in FIG. 35, the light-transmitting resin 43 is in contact with the sealing resin 41. The light-transmitting resin 43 covers respective portions of the first insulating layer 11, semiconductor element 30 and first redistribution parts 212 of the first conductor 21. The light emitted from the semiconductor element 30 passes through the light-transmitting resin 43. The light-transmitting resin 43 is made of a material containing a transparent epoxy resin or a synthetic resin containing silicone.

As shown in FIG. 35, the terminals 50 are individually connected to the portions of the through conductors 24 that are exposed from the sealing resin 41. The terminals 50 project from the sealing resin 41 in the thickness direction z.

The advantages of the semiconductor device A40 are described below.

The semiconductor device A40 includes the first insulating layer 11 having the second surface 11B, and first conductors 21 each having a first embedded part 211 and a first redistribution part 212. The first redistribution parts 212 of the first conductors 21 are disposed at the second surface 11B and connected to the first embedded parts 211 of the first conductors 21, which are connected to the electrodes 31 of the semiconductor element 30. The first insulating layer 11 has a plurality of first grooves 111 recessed from the second surface 11B in the thickness direction z. The first redistribution parts 212 of the first conductors 21 are in contact with the first grooves 111. Thus, the semiconductor device A40 also prevents misalignment between the electrodes 31 of the semiconductor element 30 and the first conductors 21 at the joint portion.

In the semiconductor device A40, the semiconductor element 30 is an optical element configured to emit light from the portion that is not covered with the first insulating layer 11. The semiconductor device A40 further includes through conductors 24 located outside the semiconductor element 30 as viewed in the thickness direction z and connected to the first redistribution parts 212 of the first conductors 21. The through conductors 24 extend from the first redistribution parts 212 of the first conductors 21 in the thickness direction z and penetrate the sealing resin 41. Such an arrangement allows the semiconductor device A40 to be mounted on a wiring board such that the side opposite the light emission side of the semiconductor element 30 in the thickness direction z faces the wiring board.

The present disclosure is not limited to the foregoing embodiments. For example, although all the foregoing embodiments have a single semiconductor element 30, a plurality of semiconductor elements may be provided. Also, all the semiconductor devices according to the foregoing embodiments have an outer shape that is rectangular as viewed in the thickness direction z, but the outer shape is not limited to a rectangular shape and may be a circular or a hexagonal shape. The specific configuration of each part of the present disclosure may be varied in design in many ways.

Various embodiments of the present disclosure are defined in the following clauses.

Clause 1.
A semiconductor device comprising:
a first insulating layer having a first surface and a second surface facing away from each other in a thickness direction;
a plurality of first conductors each having a first embedded part and a first redistribution part, at least a portion of the first embedded part being embedded in the first insulating layer, the first redistribution part being disposed at the second surface and connected to the first embedded part;
a semiconductor element that is in contact with the first surface and has a plurality of electrodes, the electrodes being provided near the first surface and connected to at least a predetermined number of the first embedded parts of the first conductors; and
a sealing resin that is in contact with the first surface and covers a portion of the semiconductor element;
wherein the first redistribution parts of the first conductors include portions located outside the semiconductor element as viewed in the thickness direction,
the first insulating layer has a plurality of first grooves recessed from the second surface in the thickness direction, and
the first redistribution parts of the first conductors are in contact with the first grooves.

Clause 2.
The semiconductor device according to clause 1, wherein the first insulating layer is made of a material containing a thermosetting synthetic resin and an additive that contains a metallic element forming portions of the first conductors.

Clause 3.
The semiconductor device according to clause 2, wherein each of the first redistribution parts of the first conductors has a base layer that is in contact with a relevant one of the first grooves and a plating layer covering the base layer, the base layer is formed of the metallic element contained in the additive, and the plating layer has a recess that is recessed in the thickness direction.

Clause 4.
The semiconductor device according to clause 3, wherein the recess extends along a direction in which a relevant one of the first redistribution parts of the first conductors extends.

Clause 5.
The semiconductor device according to clause 4, further comprising a protective layer that is in contact with the second surface,
wherein the protective layer has a plurality of openings penetrating in the thickness direction, and
portions of the first redistribution parts of the first conductors are exposed through the openings.

Clause 6.
The semiconductor device according to clause 5, further comprising a plurality of terminals,
wherein the terminals are individually bonded to the portions of the first redistribution parts of the first conductors that are exposed through the openings, and
the terminals project from the protective layer in the thickness direction.

Clause 7.
The semiconductor device according to clause 6, wherein the terminals are made of a material containing tin.

Clause 8.
The semiconductor device according to any one of clauses 1-4, further comprising: a second insulating layer having a third surface and a fourth surface facing away from each other in a thickness direction, the third surface being in contact with the second surface; and
a plurality of second conductors each having a second embedded part and a second redistribution part, the second embedded part being embedded in the second insulating layer, the second redistribution part being disposed at the fourth surface and connected to the second embedded part,
wherein the first redistribution parts of the first conductors are connected to the second embedded parts of the second conductors and covered with the second insulating layer.

Clause 9.
The semiconductor device according to clause 8, wherein the second redistribution parts of the second conductors include portions that overlap with the first redistribution parts of the first conductors as viewed in the thickness direction.

Clause 10.
The semiconductor device according to clause 9, wherein the second insulating layer has a plurality of second grooves recessed from the fourth surface in the thickness direction, and the second redistribution parts of the second conductors are in contact with the second grooves.

Clause 11.
The semiconductor device according to clause 10, wherein the second insulating layer is made of a material containing a thermosetting synthetic resin and an additive that contains a metallic element forming portions of the second conductors.

Clause 12.
The semiconductor device according to any one of clauses 1-11, further comprising a heat dissipator located on an opposite side of the first insulating layer with respect to the semiconductor element,
wherein the electrodes include a front surface electrode and a gate electrode,
the semiconductor element has a back surface electrode located farther from the first surface than are the front surface electrode and the gate electrode in the thickness direction,
the back surface electrode and selected ones of the first embedded parts of the first conductors are bonded to the heat dissipator, and at least a portion of the heat dissipator is covered with the sealing resin.

Clause 13.

The semiconductor device according to any one of clauses 1-4, wherein the semiconductor element is an optical element configured to emit light from a portion thereof that is not covered with the first insulating layer,
the semiconductor device further comprises a plurality of through conductors located outside the semiconductor element as viewed in the thickness direction and connected to the first redistribution parts of the first conductors, and
the through conductors extend from the first redistribution parts of the first conductors in the thickness direction and penetrate the sealing resin.

Clause 14.

The semiconductor device according to clause 13 further comprising a light-transmitting resin that is in contact with the sealing resin,
wherein the light-transmitting resin covers a portion of the first insulating layer, a portion of the semiconductor element, and portions of the first redistribution parts of the first conductors.

Clause 15.

The semiconductor device according to clause 13 or 14, further comprising a plurality of terminals,
wherein the terminals are bonded to portions of the through conductors that are exposed from the sealing resin, and
the terminals project from the sealing resin in the thickness direction.

Clause 16.

A method of manufacturing a semiconductor device comprising the steps of:
embedding a semiconductor element having a plurality of electrodes on one side in a thickness direction into a sealing resin such that the electrodes are exposed;
forming an insulating layer laminated on the sealing resin and covering the electrodes; and
forming a plurality of conductors each having an embedded part and a redistribution part, the embedded part being embedded in the insulating layer and connected to a relevant one of the electrodes, the redistribution part being disposed on the insulating layer and connected to the embedded part,
wherein the insulating layer is made of a material containing a thermosetting synthetic resin and an additive that contains a metallic element forming portions of the conductors, and
the step of forming a plurality of conductors includes: forming with a laser in the insulating layer a plurality of holes that expose the electrodes and a plurality of grooves recessed from a surface of the insulating layer and connected to the holes to thereby deposit a base layer that covers wall surfaces defining the holes and the grooves; and forming a plating layer covering the base layer.

Clause 17.

The method of manufacturing a semiconductor device according to clause 16, wherein the step of forming the plating layer comprises forming the plating layer by electroless plating.

The invention claimed is:

1. A semiconductor device comprising:
a semiconductor element provided with a plurality of electrodes and containing silicon carbide;
a first insulating layer including a first surface and a second surface facing away from each other in a thickness direction;
a plurality of conductors each of which includes an embedded part and a redistribution part connected to the embedded part and conducts to one of the plurality of electrodes, at least a portion of the embedded part being embedded in the first insulating layer; and
a second insulating layer disposed on the first surface,
wherein the redistribution part of at least one of the plurality of conductors includes a portion located outwards of the semiconductor element as viewed in the thickness direction,
the plurality of electrodes include a first electrode and a gate electrode that are located closer to the first surface than to the second surface in the thickness direction, and
each of the first electrode and the gate electrode is electrically connected to a respective one of the embedded parts of the plurality of conductors,
the semiconductor device further comprising a first terminal and a gate terminal,
wherein the plurality of conductors include a first conductor electrically connected to the first electrode and a second conductor electrically connected to the gate electrode,
the first terminal is electrically connected to the redistribution part of the first conductor,
the gate terminal is electrically connected to the redistribution part of the second conductor,
the first terminal and the gate terminal are located opposite to the semiconductor element with respect to the first insulating layer in the thickness direction,
the semiconductor device further comprising a heat dissipator located opposite to the first insulating layer with respect to the semiconductor element in the thickness direction,
wherein the plurality of electrodes include a second electrode located opposite to the first electrode and the gate electrode in the thickness direction, and
the second electrode is electrically connected to the heat dissipator, and
the semiconductor device further comprising a second terminal,
wherein the plurality of conductors include a third conductor electrically connected to the second electrode,
the embedded part of the third conductor is electrically connected to the heat dissipator,
the second terminal is electrically connected to redistribution part of the third conductor, and
the second terminal is located opposite to the semiconductor element with respect to the first insulating layer in the thickness direction.

2. The semiconductor device according to claim 1, wherein a dimension of the heat dissipator in the thickness direction is larger than a dimension of the semiconductor element in the thickness direction.

3. The semiconductor device according to claim 1, wherein at least a part of the heat dissipator is covered by the second insulating layer, and
the second insulating layer includes a portion located outwards of the semiconductor element and the heat dissipator as viewed in the thickness direction.

4. The semiconductor device according to claim 3, wherein the heat dissipator includes an exposed surface facing to a same side as the first surface in the thickness direction and exposed from the second insulating layer, an entirety of the semiconductor element overlaps with the exposed surface as viewed in the thickness direction.

5. The semiconductor device according to claim 1, wherein the first insulating layer includes a plurality of grooves recessed from the second surface,
   each of the redistribution parts of the plurality of conductors includes a first part and a second part connected to the first part, the first part being accommodated in one of the plurality of grooves, the second part protruding from the second surface and held in contact with the second surface.

* * * * *